United States Patent
Nasu et al.

(10) Patent No.: US 7,485,915 B2
(45) Date of Patent: Feb. 3, 2009

(54) SEMICONDUCTOR DEVICE AND METHOD HAVING CAPACITOR AND CAPACITOR INSULATING FILM THAT INCLUDES PRESET METAL ELEMENT

(75) Inventors: Hayato Nasu, Soka (JP); Takamasa Usui, Tokyo (JP); Hideki Shibata, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/418,467

(22) Filed: May 5, 2006

(65) Prior Publication Data

US 2007/0012973 A1 Jan. 18, 2007

(30) Foreign Application Priority Data

Jun. 30, 2005 (JP) ............................. 2005-192653

(51) Int. Cl.
| | |
|---|---|
| H01L 27/108 | (2006.01) |
| H01L 29/04 | (2006.01) |
| H01L 29/12 | (2006.01) |
| H01L 29/76 | (2006.01) |
| H01L 31/036 | (2006.01) |
| H01L 31/112 | (2006.01) |
| H01L 29/786 | (2006.01) |
| H01L 29/94 | (2006.01) |
| H01L 31/908 | (2006.01) |
| H01L 29/00 | (2006.01) |
| H01L 23/48 | (2006.01) |
| H01L 23/52 | (2006.01) |

(52) U.S. Cl. ............................. 257/310; 257/68; 257/71; 257/277; 257/296; 257/297; 257/298; 257/299; 257/300; 257/306; 257/307; 257/308; 257/309; 257/311; 257/312; 257/313; 257/532; 257/535; 257/758; 257/759; 257/760; 257/906; 257/908; 257/924

(58) Field of Classification Search .................. 257/68, 257/71, 277, 296–300, 306–313, 532, 535, 257/906, 908, 924, 758–760
See application file for complete search history.

(56) References Cited

U.S. PATENT DOCUMENTS 5,195,018 A * 3/1993 Kwon et al. ................. 361/313

(Continued)

FOREIGN PATENT DOCUMENTS

EP 540994 A1 * 5/1993

(Continued)

OTHER PUBLICATIONS

T. Usui, et al., "Low Resistive and Highly Reliable Cu Dual-Damascene Interconnect Technology Using Self-Formed MnSi $O_y$ Barrier Layer," Proceedings of IEEE IITC, Jun. 2005.

*Primary Examiner*—Ida M Soward
(74) *Attorney, Agent, or Firm*—Foley & Lardner LLP

(57) ABSTRACT

A semiconductor device includes a capacitor which includes a capacitor insulating film at least including a first insulating film and a ferroelectric film formed in contact with the first insulating film, containing a compound of a preset metal element and a constituent element of the first insulating film as a main component and having a dielectric constant larger than that of the first insulating film, a first capacitor electrode formed of one of Cu and a material containing Cu as a main component, and a second capacitor electrode formed to sandwich the capacitor insulating film in cooperation with the first capacitor electrode.

15 Claims, 16 Drawing Sheets

U.S. PATENT DOCUMENTS

| | | | |
|---|---|---|---|
| 5,742,471 A * | 4/1998 | Barbee et al. | 361/312 |
| 5,798,903 A * | 8/1998 | Dhote et al. | 361/321.4 |
| 5,851,870 A * | 12/1998 | Alugbin et al. | 438/239 |
| 6,040,616 A * | 3/2000 | Dennis et al. | 257/535 |
| 6,303,958 B1 * | 10/2001 | Kanaya et al. | 257/310 |
| 6,777,776 B2 * | 8/2004 | Hieda | 257/532 |
| 6,853,535 B2 * | 2/2005 | Fox et al. | 361/303 |
| 7,084,482 B2 * | 8/2006 | Lee et al. | 257/532 |
| 7,180,119 B2 * | 2/2007 | Baniecki et al. | 257/306 |
| 2001/0007366 A1 * | 7/2001 | Kim et al. | 257/306 |
| 2003/0227043 A1 * | 12/2003 | Kutsunai | 257/299 |
| 2005/0132549 A1 * | 6/2005 | Shih et al. | 29/25.41 |
| 2005/0218519 A1 | 10/2005 | Koike et al. | |
| 2005/0219794 A1 * | 10/2005 | Iguchi et al. | 361/321.2 |

FOREIGN PATENT DOCUMENTS

| | | |
|---|---|---|
| JP | 2002-319625 A | 10/2002 |
| JP | 2005-277390 A | 10/2005 |

* cited by examiner 11-1: Inter-level insulating film (SiO₂ film)

33: CuMn alloy layer

17: Insulating film (SiO₂ film)

15: Ferroelectric film ($Mn_xSi_yO_z$ film)

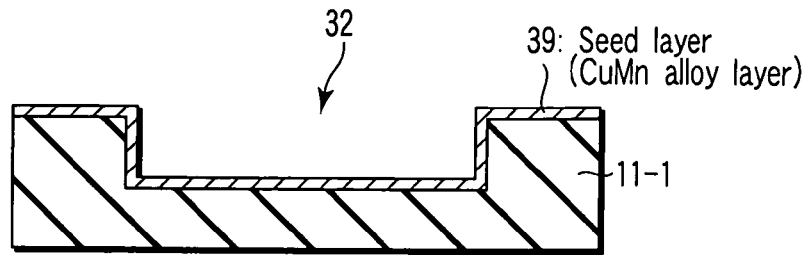
F I G. 25
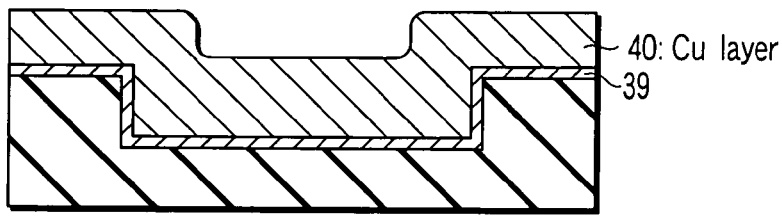
F I G. 26
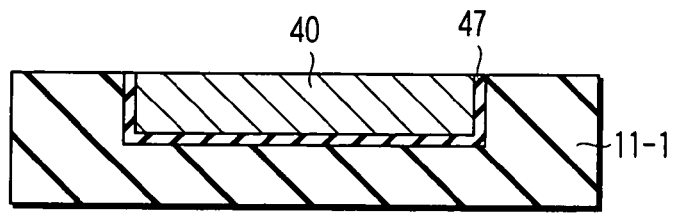
F I G. 27
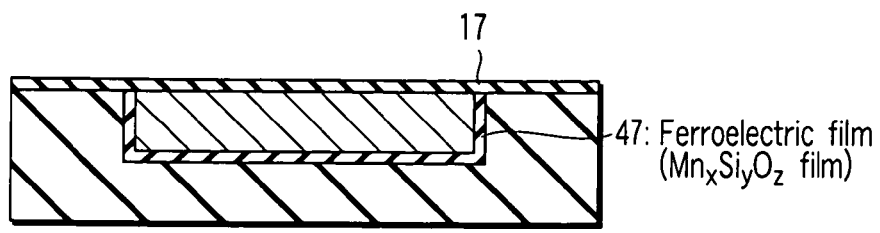
F I G. 28

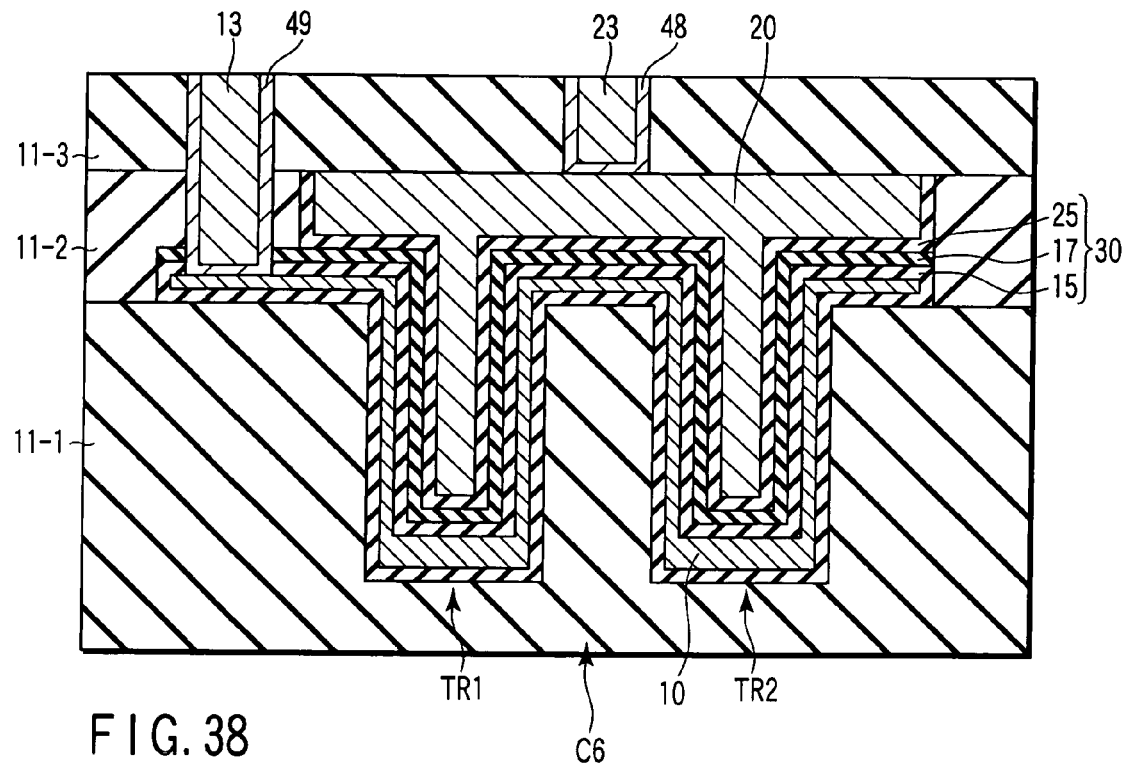
F I G. 38
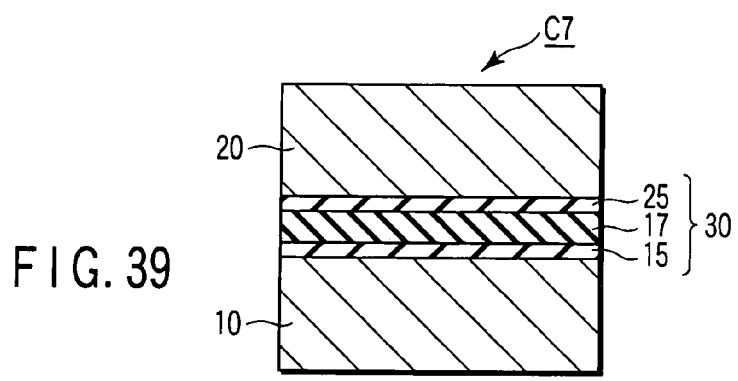
F I G. 39
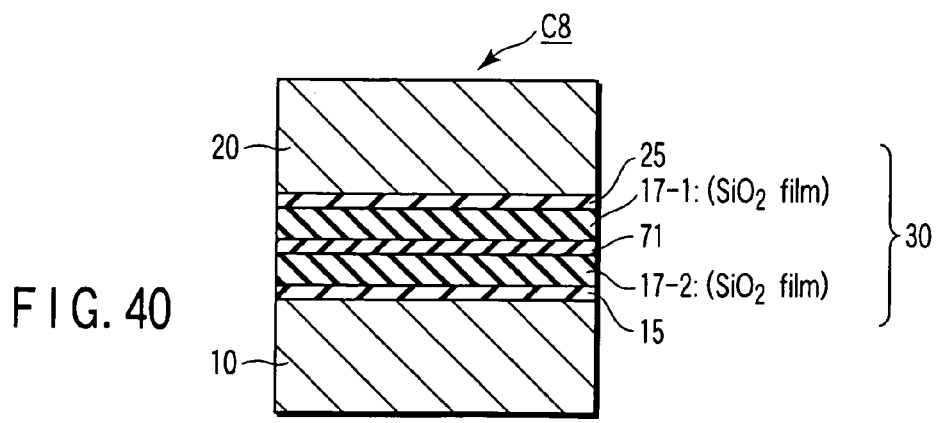
F I G. 40

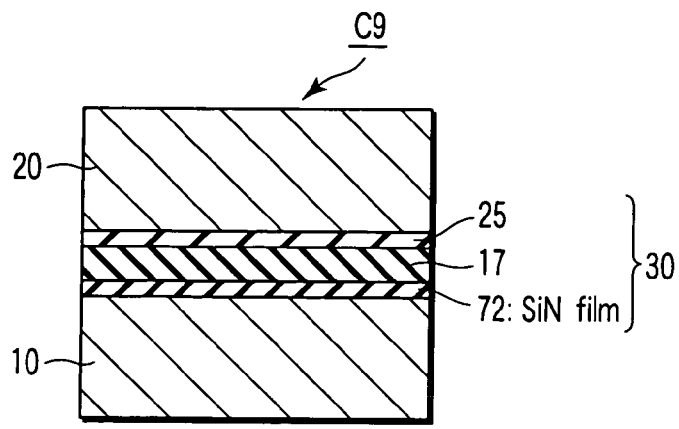
F I G. 41
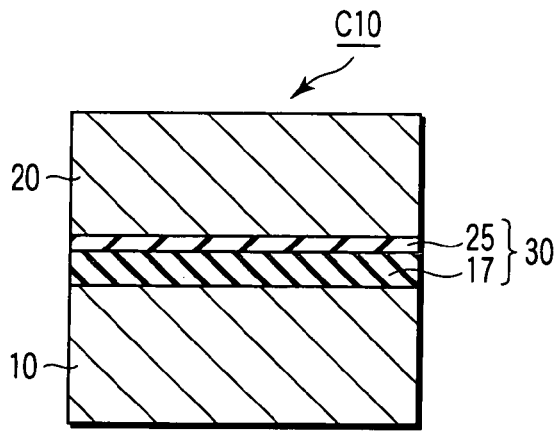
F I G. 42
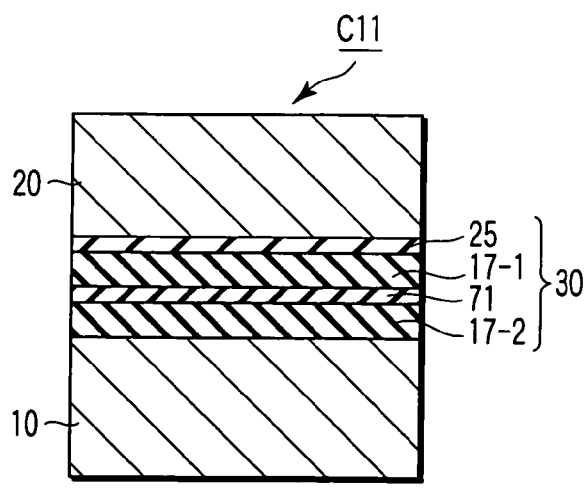
F I G. 43

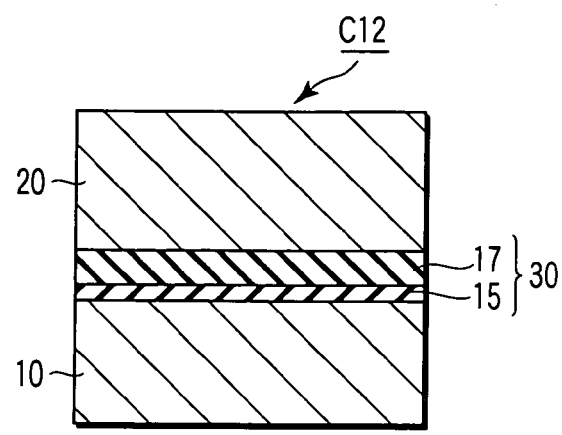
F I G. 44
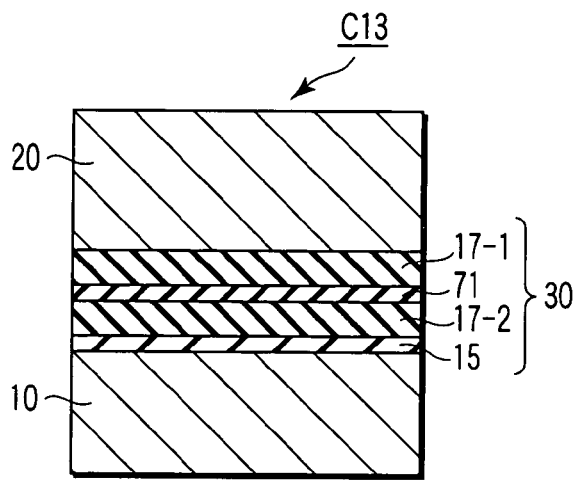
F I G. 45
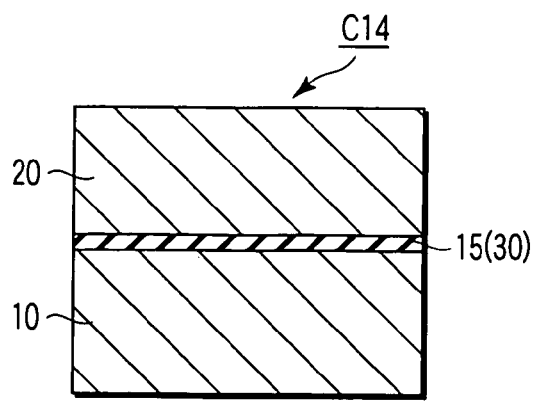
F I G. 46

SEMICONDUCTOR DEVICE AND METHOD HAVING CAPACITOR AND CAPACITOR INSULATING FILM THAT INCLUDES PRESET METAL ELEMENT

CROSS-REFERENCE TO RELATED APPLICATIONS

This application is based upon and claims the benefit of priority from prior Japanese Patent Application No. 2005-192653, filed Jun. 30, 2005, the entire contents of which are incorporated herein by reference.

BACKGROUND OF THE INVENTION

1. Field of the Invention

This invention relates to a semiconductor device and a manufacturing method thereof and is applied to an MIM (metal insulator metal) capacitor structure using a multilayer interconnection and a manufacturing method thereof, for example.

2. Description of the Related Art

Recently, it is more strongly required to develop a capacitor having large capacitance and stably operated under high frequencies in the field of an MIM capacitor (refer to Jpn. Pat. Appln. KOKAI Publication No. 2002-319625) utilizing a multilayer interconnection which is one of applications of an LSI (Large Scale Integrated) circuit as the higher performance of the LSI is required.

The capacitance characteristic of the MIM capacitor is determined by the area of the capacitor electrode (workability of the capacitor electrode) and the film thickness, thickness uniformity and dielectric constant (capacitance) of the capacitor insulating film. Therefore, in order to realize the large capacitance, it is necessary to enlarge the area of the capacitor electrode or reduce the film thickness, make the film thickness uniform and enhance the dielectric constant of the capacitor insulating film.

However, since it is also simultaneously required to reduce the dimensions determined by the LSI design, expansion of the area of the capacitor electrode has a limitation and it is extremely difficult to attain a desired capacitor electrode at present.

It is required to reduce the film thickness, make the film thickness uniform and enhance the dielectric constant of the capacitor insulating film. The conventional capacitor insulating film is formed by use of a film formation method such as a thermal oxidation method, sputtering method, CVD (Chemical Vapor Deposition) method, for example. Therefore, it is difficult to reduce the film thickness, make the film thickness uniform and enhance the dielectric constant of the capacitor insulating film. Particularly, for example, when the sputtering method or CVD method is used, the film thickness varies in the extremely thin film region of 10 nm or less and it is extremely difficult to form a film with uniform thickness.

BRIEF SUMMARY OF THE INVENTION

A semiconductor device comprising: a first capacitor which includes: a first capacitor insulating film at least including a first insulating film and a first ferroelectric film formed in contact with the first insulating film, containing a compound of a preset metal element and a constituent element of the first insulating film as a main component and having a dielectric constant larger than that of the first insulating film, and first and second capacitor electrodes formed to sandwich the first capacitor insulating film and formed of one of Cu and a material containing Cu as a main component.

A semiconductor device comprising: a capacitor which includes: a capacitor insulating film at least including a first insulating film and a ferroelectric film formed in contact with the first insulating film, containing a compound of a preset metal element and a constituent element of the first insulating film as a main component and having a dielectric constant larger than that of the first insulating film, a first capacitor electrode formed of one of Cu and a material containing Cu as a main component, and a second capacitor electrode formed to sandwich the capacitor insulating film in cooperation with the first capacitor electrode.

A method of manufacturing a semiconductor device comprising: forming a groove in an inter-level insulating film, embedding a first alloy layer used as a first capacitor electrode, and formed of a material containing Cu as a main component and a first preset metal element in the groove, forming an insulating film on the first alloy layer, performing heat treatment to form a first ferroelectric film containing a compound of the first preset metal element and a constituent element of the insulating film as a main component and having a dielectric constant larger than that of the insulating film on an interface between the insulating film and the first alloy layer in a self-alignment fashion, and forming a second alloy layer used as a material of a second capacitor electrode and containing the preset metal element and formed of a material containing Cu as a main component on the insulating film.

BRIEF DESCRIPTION OF THE SEVERAL VIEWS OF THE DRAWING

FIG. 25 is a cross sectional view showing one manufacturing step of the semiconductor device according to the second embodiment of this invention;

FIG. 26 is a cross sectional view showing one manufacturing step of the semiconductor device according to the second embodiment of this invention;

FIG. 27 is a cross sectional view showing one manufacturing step of the semiconductor device according to the second embodiment of this invention;

FIG. 28 is a cross sectional view showing one manufacturing step of the semiconductor device according to the second embodiment of this invention;

FIG. 38 is a cross sectional view showing a semiconductor device according to a seventh embodiment of this invention;

FIG. 39 is a cross sectional view showing a semiconductor device according to an eighth embodiment of this invention;

FIG. 40 is a cross sectional view showing the semiconductor device according to the eighth embodiment of this invention;

FIG. 41 is a cross sectional view showing the semiconductor device according to the eighth embodiment of this invention;

FIG. 42 is a cross sectional view showing the semiconductor device according to the eighth embodiment of this invention;

FIG. 43 is a cross sectional view showing the semiconductor device according to the eighth embodiment of this invention;

FIG. 44 is a cross sectional view showing the semiconductor device according to the eighth embodiment of this invention;

FIG. 45 is a cross sectional view showing the semiconductor device according to the eighth embodiment of this invention; and FIG. 46 is a cross sectional view showing the semiconductor device according to the eighth embodiment of this invention.

DETAILED DESCRIPTION OF THE INVENTION

There will now be described embodiments of this invention with reference to the accompanying drawings. In this explanation, common reference symbols are attached to like portions throughout the drawings.

First Embodiment

Figure 1:
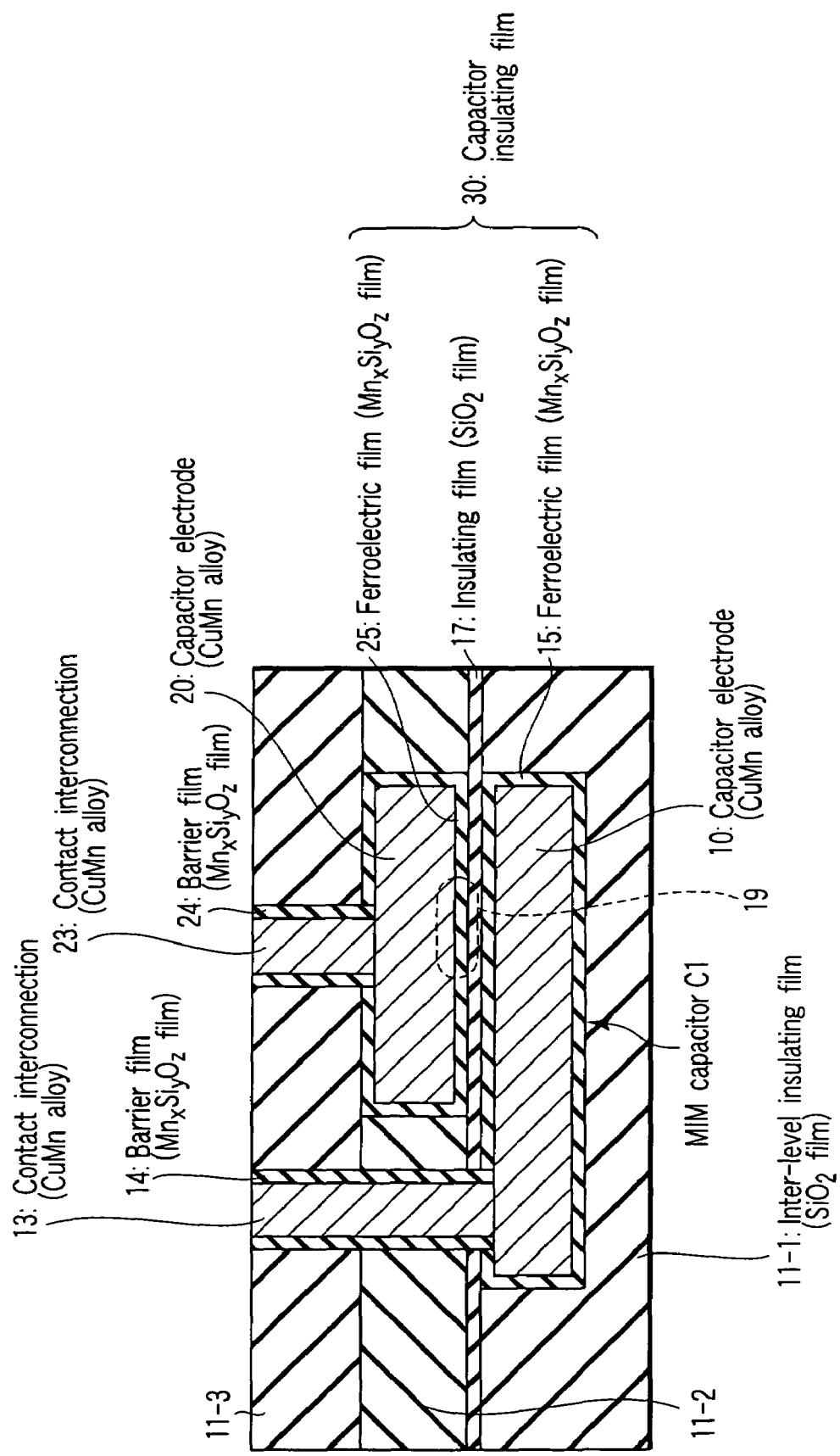
FIG. 1 is a cross sectional view showing a semiconductor device according to a first embodiment of this invention.
Figure 2:
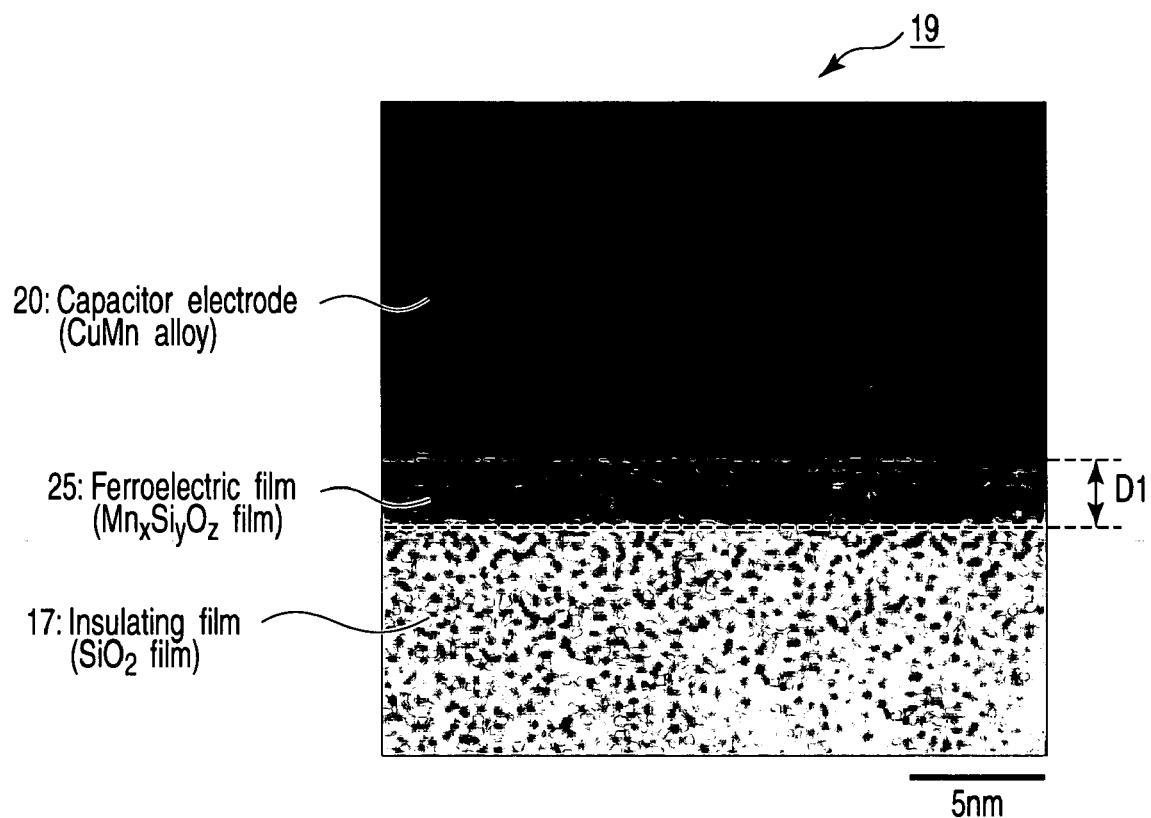
FIG. 2 is a view showing a microphotograph of a cross sectional TEM image of a portion near a capacitor insulating film shown in FIG. 1.

First, a semiconductor device according to a first embodiment of this invention is explained with reference to FIGS. 1 and 2. FIG. 1 is a cross sectional view schematically showing the semiconductor device according to the first embodiment. FIG. 2 is a view showing a microphotograph of a cross sectional TEM image of a portion near a region 19 in FIG. 1. The present embodiment relates to an MIM (metal insulator metal) capacitor using a multilayer interconnection which is one of applications of an LSI circuit and a manufacturing method thereof.

As shown in FIG. 1, an MIM capacitor C1 is formed in inter-level insulating films 11-1 to 11-3. The MIM capacitor C1 includes a capacitor electrode (bottom electrode) 10, capacitor electrode (top electrode) 20, contact interconnections 13, 23 and capacitor insulating film 30.

The capacitor electrode (bottom electrode) 10 includes a ferroelectric film 15 which is formed of a CuMn alloy (copper-manganese) or the like formed of Cu or a material containing Cu as a main component (that is, 50 at % or more) provided in a groove in the inter-level insulating film 11-1 and formed on the interface with the inter-level insulating film 11-1. The ferroelectric film 15 formed on the interface with the inter-level insulating film 11-1 acts as a barrier film which prevents diffusion of Cu elements in the capacitor electrode 10.

The capacitor electrode (top electrode) 20 includes a ferroelectric film 25 which is formed of a CuMn alloy or the like formed of Cu or a material containing Cu as a main component provided in a groove in the inter-level insulating film 11-2 and is formed on the interface with the inter-level insulating film 11-2. The ferroelectric film 25 formed on the interface with the inter-level insulating film 11-2 acts as a barrier film which prevents diffusion of Cu elements in the capacitor electrode 20.

Portions of the capacitor electrodes 10, 20 on which the capacitor insulating film 30 is not formed are also used as multilayer interconnections.

The contact interconnection 13 is formed through the inter-level insulating films 11-2, 11-3, insulating film 17 and ferroelectric film 15 and electrically connected to the capacitor electrode 10. It is formed of a CuMn alloy or the like containing Cu as a main component. Further, a barrier film 14 which functions as a barrier to prevent diffusion of Cu elements in the contact interconnection 13 is formed on the interfaces with the inter-level insulating films 11-2, 11-3. The barrier film 14 is formed of an $Mn_xSi_yO_z$ film or the like.

The contact interconnection 23 is formed through the inter-level insulating film 11-3 and ferroelectric film 25 and electrically connected to the capacitor electrode 20. It is formed of a CuMn alloy or the like containing Cu as a main component. Further, a barrier film 24 which functions as a barrier to prevent diffusion of Cu elements in the contact interconnection 23 is formed on the interface with the inter-level insulating film 11-3. The barrier film 14 is formed of an $Mn_xSi_yO_z$ film or the like.

The capacitor insulating film 30 is disposed between the opposing faces of the capacitor electrodes 10 and 20 and includes the insulating film 17 and ferroelectric films 15, 25 each having a dielectric constant larger than that of the insulating film 17.

In this example, the insulating film 17 is formed of an $SiO_2$ film (silicon oxide film).

The ferroelectric film 15 is formed in contact with the undersurface of the insulating film 17, has a dielectric constant larger than that of the insulating film 17, contains a compound of a preset metal element a and a constituent element of the insulating film 17 as a main component and is formed in a self-alignment fashion. In this example, the ferroelectric film 15 is formed of an $Mn_xSi_yO_z$ film (manganese silicon oxide film) or the like.

The ferroelectric film 25 is formed in contact with the upper surface of the insulating film 17, has a dielectric constant larger than that of the insulating film 17, contains a compound of a preset metal element a and a constituent element of the insulating film 17 as a main component and is formed in a self-alignment fashion. In this example, the ferroelectric film 25 is formed of an $Mn_xSi_yO_z$ film. The composition of the $Mn_xSi_yO_z$ film of the ferroelectric films 15, 25 is specifically expressed by 1:1:3 to 1:3:5 as x:y:z of $Mn_xSi_yO_z$.

As shown in FIG. 2, the ferroelectric film 25 on the insulating film 17 is formed of a thin and uniform $Mn_xSi_yO_z$ film. The film thickness D1 of the ferroelectric film 15 is approximately 2 nm to 3 nm. Therefore, it functions as a preferable capacitor insulating film together with the insulating film 17.

The preset metal element α is not limited to Mn as in the present embodiment and may be an element selected from a group consisting of Nb, Zr, Cr, V, Y, Tc and Re. Each of the metal elements α is a metal element which has diffusion speed higher than Cu in a layer containing Cu and more easily reacts with oxygen than Cu so as to form a thermally stabilized oxide.

The insulating film 17 and inter-level insulating films 11-1 to 11-3 can contain O and at least one element selected from a group consisting of Si, C and F. As a specific material, for example, $SiO_2$, $SiO_xC_y$, $SiO_xC_yH_z$, $SiO_xF_y$ and the like can be provided.

Further, the ferroelectric films 15, 25 can contain a material selected from a group consisting of $α_xO_y$, $α_xSi_yO_z$, $α_xC_yO_z$ and $α_xF_yO_z$ as a main component. In this case, a indicates the preset metal element α.

<Manufacturing Method>

Next, a manufacturing method of the semiconductor device according to the present embodiment is explained with reference to FIGS. 3 to 13 by taking the semiconductor device shown in FIGS. 1 and 2 as an example.

Figure 3:
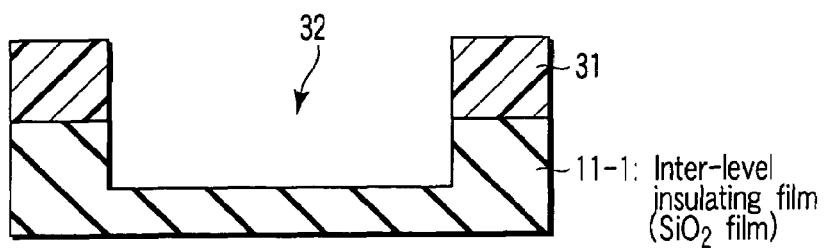
FIG. 3 is a cross sectional view showing one manufacturing step of the semiconductor device according to the first embodiment of this invention.

First, as shown in FIG. 3, for example, an $SiO_2$ film (silicon oxide film) is deposited on a semiconductor substrate in which a semiconductor element is formed thereon (not shown) by a CVD method to form an inter-level insulating film 11-1.

Then, photoresist 31 is coated on the inter-level insulating film 11-1 and the thus formed photoresist film 31 is subjected to the exposing and developing processes to form a groove on a forming region of the capacitor electrode 10. After this, an anisotropic etching process, for example, an RIE (Reactive Ion Etching) process is performed to etch a portion which reaches a preset portion of the inter-level insulating film 11-1 to form a groove 32 with the photoresist film 31 used as a mask.

Figure 4:
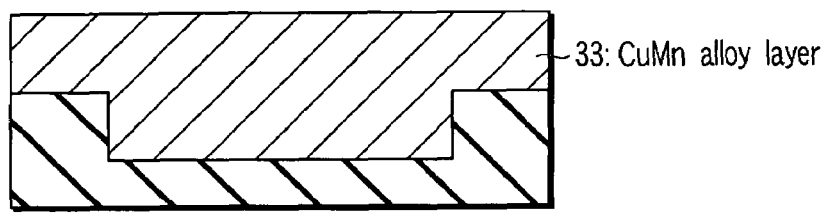
FIG. 4 is a cross sectional view showing one manufacturing step of the semiconductor device according to the first embodiment of this invention.

Next, as shown in FIG. 4, a CuMn (copper-manganese) alloy layer 33 is formed in the groove 32 and on the inter-level insulating film 11-1 by use of a sputtering method or CVD method, for example.

Figure 5:
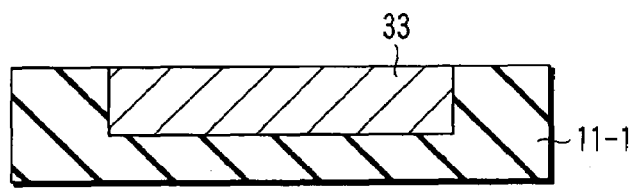
FIG. 5 is a cross sectional view showing one manufacturing step of the semiconductor device according to the first embodiment of this invention.

Then, as shown in FIG. 5, the CuMn alloy layer 33 is polished and made flat to the surface of the inter-level insulating film 11-1 and thus embedded in the groove 32 by using a CMP (Chemical Mechanical Polishing) method, for example.

Figure 6:
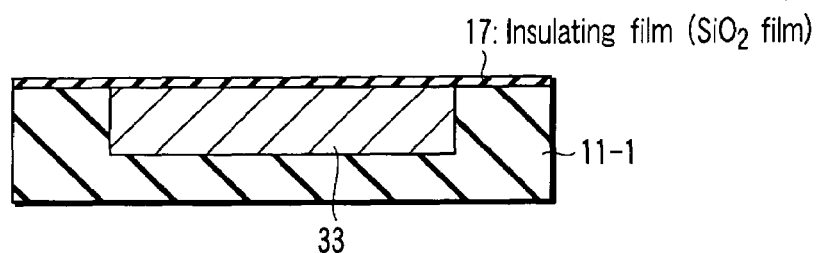
FIG. 6 is a cross sectional view showing one manufacturing step of the semiconductor device according to the first embodiment of this invention.

Next, as shown in FIG. 6, an $SiO_2$ film (insulating film) 17 is formed on the inter-level insulating film 11-1 and CuMn alloy layer 33 by use of the CVD method or the like.

Figure 7:
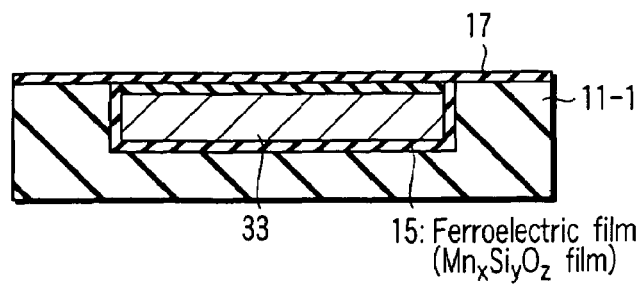
FIG. 7 is a cross sectional view showing one manufacturing step of the semiconductor device according to the first embodiment of this invention.

Further, as shown in FIG. 7, for example, the heat treatment is performed for 30 min to 60 min at temperatures of 200° C. to 600° C. while the CuMn alloy layer 33 is kept set in contact with the insulating layer 17 and inter-level insulating film 11-1. By the above heat treatment, Mn elements in the CuMn alloy layer 33 are diffused to react with Si elements and O elements in the insulating layer 17 and inter-level insulating film 11-1. As a result, a uniform $Mn_xSi_yO_z$ film (ferroelectric film) 15 with extremely thin film thickness (2 nm to 3 nm) is formed on the interfaces in a self-alignment fashion.

The $Mn_xSi_yO_z$ film (ferroelectric film) 15 formed in the above process has a feature that the film thickness thereof can be kept constant irrespective of the Mn concentration in the CuMn alloy layer 33 and temperatures in the heat treatment. This is considered because Mn in the CuMn alloy layer 33 can take in no more oxygen (O) in the insulating film ($SiO_2$ film) 17 and the reaction process is stopped if the $Mn_xSi_yO_z$ film 15 is uniformly formed.

It is possible to precipitate almost all of the Mn elements in the CuMn alloy layer 33 by suitably selecting the concentration of the Mn elements and reaction condition such as time of the heat treatment process. In this case, the capacitor electrode 10 can be formed of pure Cu.

Figure 8:
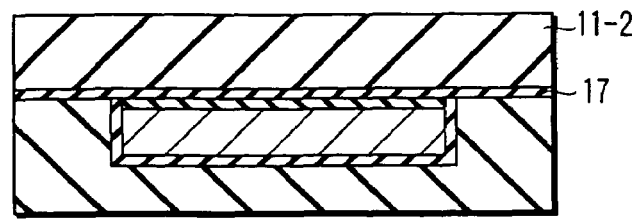
FIG. 8 is a cross sectional view showing one manufacturing step of the semiconductor device according to the first embodiment of this invention.

Next, as shown in FIG. 8, an $SiO_2$ film is deposited on the insulating film 17 by use of the CVD method, for example, to form an inter-level insulating film 11-2.

Figure 9:
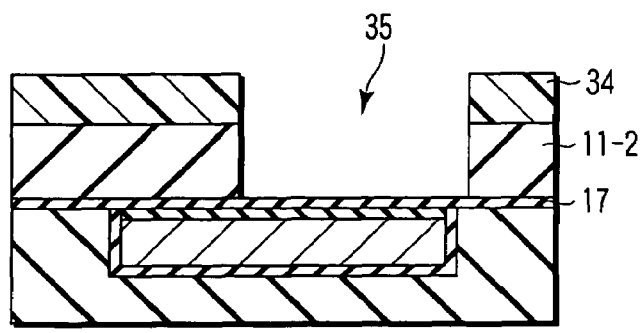
FIG. 9 is a cross sectional view showing one manufacturing step of the semiconductor device according to the first embodiment of this invention.

Then, as shown in FIG. 9, photoresist 34 is coated on the inter-level insulating film 11-2 and the thus formed photoresist film 34 is subjected to the exposing and developing processes to form a groove on a capacitor electrode forming region. After this, an anisotropic etching process such as the RIE process is performed to etch a portion which reaches the surface of the insulating film 17 so as to form a groove 35 with the photoresist film 34 used as a mask.

Figure 10:
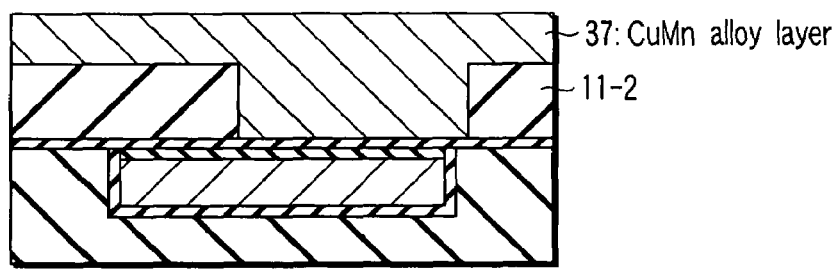
FIG. 10 is a cross sectional view showing one manufacturing step of the semiconductor device according to the first embodiment of this invention.

Next, as shown in FIG. 10, a CuMn alloy layer 37 is formed in the groove 35 and on the inter-level insulating film 11-2 by use of a sputtering method or the like, for example.

Figure 11:
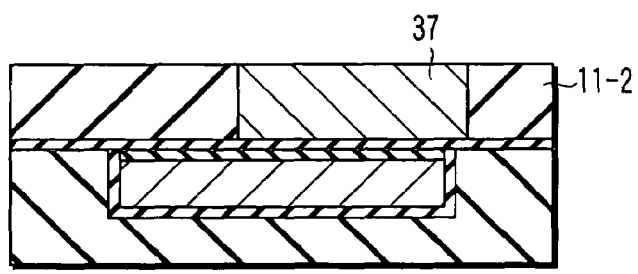
FIG. 11 is a cross sectional view showing one manufacturing step of the semiconductor device according to the first embodiment of this invention.

Then, as shown in FIG. 11, the CuMn alloy layer 37 is polished and made flat to the surface of the inter-level insulating film 11-2 and thus embedded in the groove 37 by using the CMP method, for example.

Figure 12:
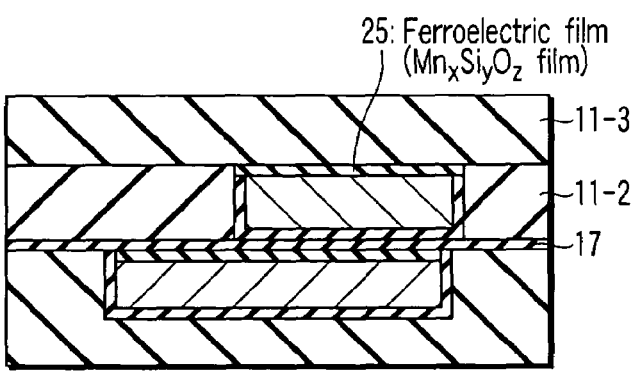
FIG. 12 is a cross sectional view showing one manufacturing step of the semiconductor device according to the first embodiment of this invention.

Next, as shown in FIG. 12, for example, an $SiO_2$ film is deposited on the CuMn alloy layer 37 and inter-level insulating film 11-2 by use of the CVD method or the like to form an inter-level insulating film 11-3. After this, the heat treatment is performed for 30 min to 60 min at temperatures of 200° C. to 600° C. while the CuMn alloy layer 37 is kept set in contact with the insulating layer 17 and inter-level insulating films 11-2, 11-3. By the above heat treatment, Mn elements in the CuMn alloy layer 37 are diffused to react with Si elements and O elements in the insulating layer 17 and inter-level insulating films 11-2, 11-3. As a result, a uniform $Mn_xSi_yO_z$ film (ferroelectric film) 25 with extremely thin film thickness (2 nm to 3 nm) is formed on the interfaces in a self-alignment fashion.

Like the above case, the $Mn_xSi_yO_z$ film (ferroelectric film) 25 formed in the above process has a feature that the film thickness thereof can be kept constant irrespective of the Mn concentration in the CuMn alloy layer 37 and temperatures in the heat treatment. This is considered because Mn in the CuMn alloy layer 37 can take in no more oxygen (O) in the insulating film ($SiO_2$ film) 17 and inter-level insulating films 11-2, 11-3 and the reaction process is stopped if the $Mn_xSi_yO_z$ film 25 is uniformly formed.

It is possible to precipitate almost all of the Mn elements in the CuMn alloy layer 37 by suitably selecting the concentration of the Mn elements and reaction condition such as time of the heat treatment process. In this case, the capacitor electrode 20 can be formed of pure Cu.

After this, for example, a trench which penetrates through the inter-level insulating films 11-3, 11-2, insulating film 17 and ferroelectric film 15 is formed and a trench which penetrates through the inter-level insulating film 11-3 and ferroelectric film 25 is formed by use of an anisotropic etching process such as the RIE method. Then, after a CuMn alloy layer is formed on the inter-level insulating film 11-3 by use of the sputtering method or the like, the CuMn layer is embedded in the trench by use of the CVD method or the like to form contact interconnections 13, 23.

Figure 13:
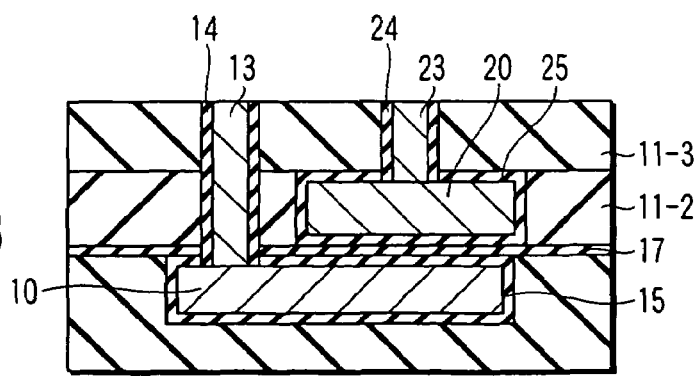
FIG. 13 is a cross sectional view showing one manufacturing step of the semiconductor device according to the first embodiment of this invention.

Next, as shown in FIG. 13, barrier films 14, 24 are formed on the interfaces between the CuMn alloy layer 13 and the inter-level insulating films 11-3, 11-2 and the interface between the CuMn alloy layer 23 and the inter-level insulating film 11-3 by performing the heat treatment which is the same as those performed for the ferroelectric films 15, 25.

The barrier films 14, 24 are compound $Mn_xSi_yO_z$ films of Mn elements in the CuMn alloy layers 13, 23 and Si elements and O elements in the inter-level insulating films 11-2, 11-3.

By the above manufacturing process, the semiconductor device shown in FIGS. 1 and 2 is manufactured.

According to the semiconductor device and the manufacturing method thereof in the present embodiment, the following effects (1) to (5) are attained.

(1) It is advantageous in attaining large capacitance of capacitor:

As described above, the ferroelectric films ($Mn_xSi_yO_z$ films) 15, 25 are reaction-formed films which are formed by performing the heat treatment to diffuse Mn elements in the CuMn alloy layers 33, 37 and react the Mn elements with Si elements and O elements in the insulating layer 17 and which are formed on the interface in a self-alignment fashion.

Therefore, extremely thin (2 nm to 3 nm) and uniform ferroelectric films 15, 25 which are difficult to form by use of the film formation process of the conventional sputtering method or the like can be formed. As a result, since the capacitor insulating film 30 including the ferroelectric films 15, 25 having a desired dielectric constant together with the insulating film 17 can be formed, it is advantageous in attaining large capacitance.

It is confirmed that the ferroelectric films 15, 25 formed in the above step always have constant film thickness irrespective of the Mn concentration in the CuMn alloy layers 33, 37 (FIG. 2). This is considered because Mn in the CuMn alloy layers 33, 37 can take in no more oxygen (O) in the insulating film ($SiO_2$ film) 17 and the reaction process is stopped if the $Mn_xSi_yO_z$ films 15, 25 are uniformly formed.

Thus, the ferroelectric films 15, 25 are extremely effectively used as the capacitor insulating film 30 because they can be formed with thin film thickness, uniform film thickness and large dielectric constant.

(2) It is advantageous in manufacturing cost:

It is also required to enhance the performance of the capacitor according to the request for high performance of the LSI, but it becomes more difficult to select a material and select a film formation method. However, as described above, the ferroelectric films 15, 25 can be formed only by use of the heat treatment without using the film formation process (for example, sputtering method or CVD method).

Further, when the ferroelectric films 15, 25 are formed, a CuMn alloy can be used as a target in the sputtering process. Therefore, the conventional manufacturing apparatus used for the sputtering process can be used as it is and it is not necessary to make an equipment investment for a new manufacturing apparatus. Thus, it is advantageous in the manufacturing cost.

(3) It is advantageous in lowering resistance of capacitor electrodes 10, 20:

When the heat treatment for forming the ferroelectric films ($Mn_xSi_yO_z$ films) 15, 25 is performed, Mn in the CuMn alloy layers 33, 37 used as materials of the capacitor electrodes 10, 20 is diffused into the interfaces. The purity of Cu in the CuMn alloy layers 33, 37 left behind after the heat treatment process is further enhanced and the resistance thereof can be lowered in comparison with that attained before the heat treatment process. Thus, the resistances of the capacitor electrodes 10, 20 can be lowered and it is advantageous in lowering the resistance.

Almost all of the Mn elements in the CuMn alloy layers 33, 37 can be precipitated by adequately selecting the concentration of the Mn elements and the reaction condition of the heat treatment process. In this case, the capacitor electrodes 10, 20 can be formed of pure Cu.

(4) Reliability of capacitor electrodes 10, 20 containing Cu as main component can be enhanced:

As described above, the capacitor electrodes 10, 20 are formed of a CuMn alloy layer containing Cu as a main component.

In this case, Cu tends to mutually diffuse with respect to surrounding insulating films and easily react with oxygen in an oxygen atmosphere to form a Cu oxide film. Therefore, it is necessary to form a diffusion barrier film of tantalum (Ta) or tantalum nitride (TaN) before forming a metal layer containing Cu as a main component. Particularly, when a buried Cu layer is formed in the inter-level insulating film as in the damascene structure of the present embodiment, diffusion of Cu into the insulating film becomes more significant and it is normally necessary to form a barrier film for preventing diffusion.

However, in the case of the present embodiment, the ferroelectric films ($Mn_xSi_yO_z$ films) 15, 25 can be formed on the interfaces with the CuMn alloy layers 33, 37 in a self-alignment fashion by performing the heat treatment. Thus, the ferroelectric films 15, 25 acting as barrier films which prevent diffusion of Cu in the capacitor electrodes 10, 20 can be simultaneously formed together with the interfaces formed in contact with the insulating film 17 and acting as the capacitor insulating films. As a result, diffusion of Cu in the capacitor electrodes 10, 20 can be prevented, electromigration by interface diffusion can be prevented and the reliability of the capacitor electrodes 10, 20 can be enhanced.

(5) It is effective in miniaturizing capacitor electrodes 10, 20 containing Cu as main component:

As described in the item (4), in the prior art, it is necessary for the diffusion barrier film to have a film thickness of 10 nm or more in order to attain the reliability of the capacitor electrodes containing Cu as a main component. Therefore, if an attempt is made to form the capacitor electrodes containing Cu as a main component, the occupied area of the capacitor electrode is increased.

However, since the ferroelectric films 15, 25 acting as barrier films which prevent diffusion of Cu in the capacitor electrodes 10, 20 can be formed in a self-alignment fashion, the area of the barrier films can be reduced or the barrier films can be made unnecessary (barrierless). Therefore, the occupied area of the barrier films can be reduced and it is effective to miniaturize the capacitor electrodes 10, 20. If the barrier films are made unnecessary, capacitor electrodes containing Cu as a main component with the barrierless structure in which the barrier film forming process is completely omitted can be considered.

Since the structure and the manufacturing method of the contact interconnections 13, 23 are substantially the same as those of the capacitor electrodes 10, 20, the same effects as the effects (2) to (5) can be attained.

Further, portions of the capacitor electrodes 10, 20 on which the capacitor insulating film 30 is not formed are also used as a multilayer interconnection. Therefore, if they act as the multilayer interconnection, the same effects as the effects (2) to (5) can be attained.

Modification 1

One Example of Forming Method of Ferroelectric Film

Next, a manufacturing method of the semiconductor device according to a modification 1 of this invention is explained with reference to FIGS. 14 to 19. The manufacturing method of the semiconductor device according to the modification relates to a case wherein a seed layer is used when the ferroelectric film 15 is formed to manufacture the semiconductor device shown in FIGS. 1 and 2. In this explanation, the explanation for portions which are the same as those of the first embodiment is omitted.

Figure 14:
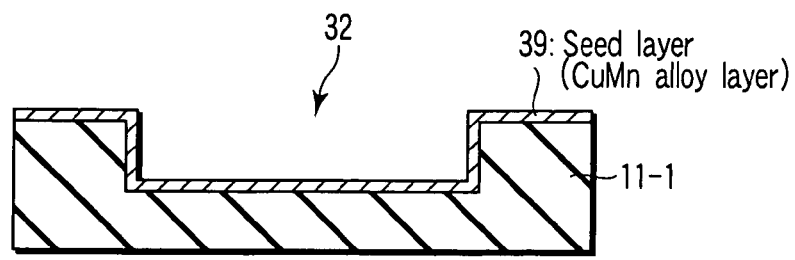
FIG. 14 is a cross sectional view showing one manufacturing step of a semiconductor device according to a modification 1 of this invention.

As shown in FIG. 14, a groove 32 is formed in a capacitor electrode 10 forming region of an inter-level insulating film 11-1 by use of the same manufacturing process as that of the first embodiment. Then, a CuMn alloy layer is deposited in the groove 32 and on the inter-level insulating film 11-1 by use of a plating method, for example, to form a seed layer 39.

Figure 15:
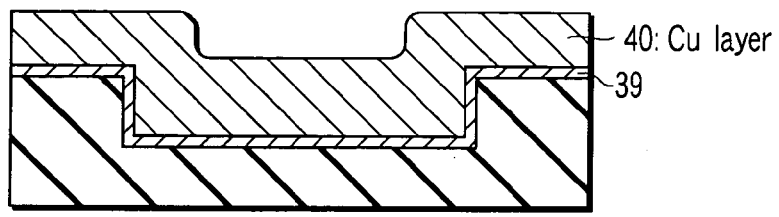
FIG. 15 is a cross sectional view showing one manufacturing step of the semiconductor device according to the modification 1 of this invention.

Next, as shown in FIG. 15, a Cu layer 40 is formed on the seed layer 39 by use of a sputtering method, for example.

Figure 16:
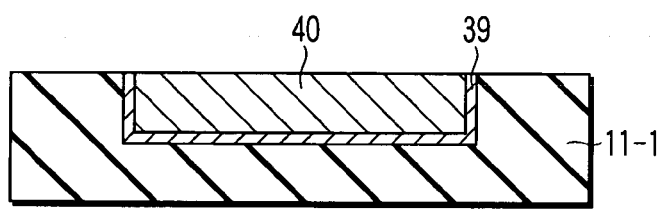
FIG. 16 is a cross sectional view showing one manufacturing step of the semiconductor device according to the modification 1 of this invention.

Then, as shown in FIG. 16, the seed layer 39 and Cu layer 40 are polished to the surface of the inter-level insulating film 11-1, made flat and thus embedded in the groove 32.

Figure 17:
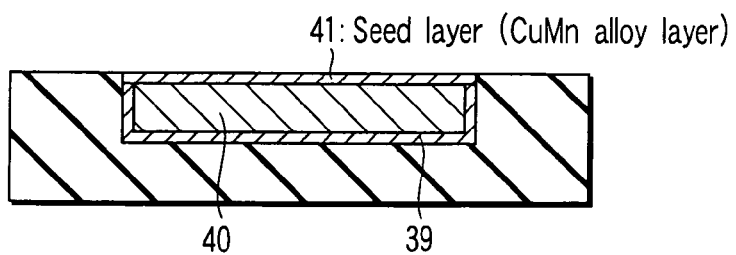
FIG. 17 is a cross sectional view showing one manufacturing step of the semiconductor device according to the modification 1 of this invention.

After this, as shown in FIG. 17, the surfaces of the seed layer 39 and Cu layer 40 are recessed by use of a wet etching method, for example. Then, a CuMn alloy layer is deposited on the recessed surfaces of the seed layer 39 and Cu layer 40 and polished to form a seed layer 41 by use of the same forming process as that for forming the seed layer 39.

Figure 18:
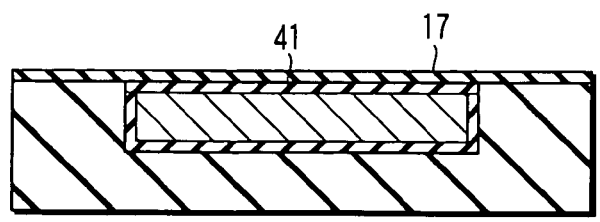
FIG. 18 is a cross sectional view showing one manufacturing step of the semiconductor device according to the modification 1 of this invention.
Figure 19:
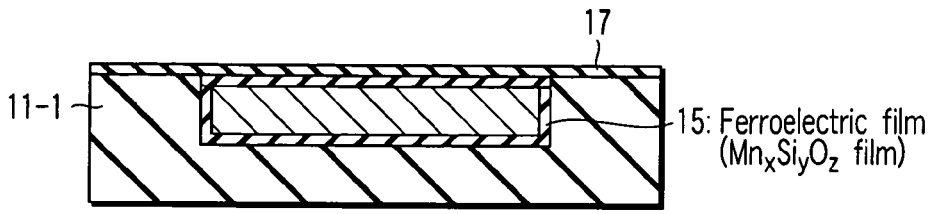
FIG. 19 is a cross sectional view showing one manufacturing step of the semiconductor device according to the modification 1 of this invention.

Next, as shown in FIG. 18, an $SiO_2$ film is deposited on the seed layer 41 and inter-level insulating film 11-1 to form an insulating film 17 by use of the CVD method, for example.

After this, the heat treatment is performed for 30 min to 60 min at temperatures of 200° C. to 600° C., for example, while the seed layers 39 and 41 are respectively kept set in contact with the inter-level insulating film 11-1 and insulating film 17. By the heat treatment, Mn elements in the seed layer 39 are diffused to react with Si elements and O elements in the inter-level insulating film 11-1 and Mn elements in the seed layer 41 are diffused to react with Si elements and O elements in the insulating film 17. Thus, the seed layers 39, 41 are formed as uniform and extremely thin (2 nm to 3 nm) $Mn_xSi_yO_z$ films (ferroelectric films) 15 in a self-alignment fashion.

Then, substantially the same manufacturing process as that used in the first embodiment is used to manufacture the semiconductor device shown in FIGS. 1 and 2.

According to the manufacturing method of the semiconductor device of the modification 1, the same effects as the effects (1) to (5) explained above can be attained. Further, since the general manufacturing process for forming the seed layers 39, 41 can be used, it is advantageous in the manufacturing cost.

Both of the seed layers 39 and 41 are not always necessary and it is sufficient if one of the seed layers 39 and 41 is provided.

Modification 2

One Example of Forming Method of Ferroelectric Film

Next, a manufacturing method of a semiconductor device according to a modification 2 of this invention is explained with reference to FIGS. 20 to 23. The manufacturing method of the semiconductor device according to the modification relates to a case wherein an ion-implantation process is used when the ferroelectric film is formed in order to manufacture the semiconductor device shown in FIGS. 1 and 2. In this explanation, the explanation for portions which are the same as those of the first embodiment is omitted.

Figure 20:
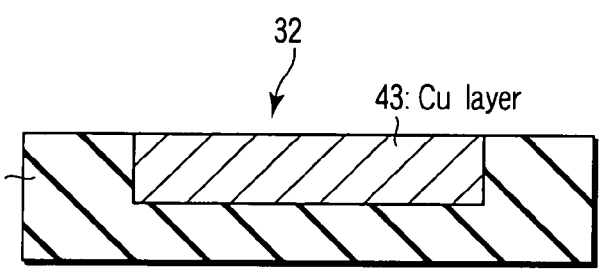
FIG. 20 is a cross sectional view showing one manufacturing step of a semiconductor device according to a modification 2 of this invention.

As shown in FIG. 20, a groove 32 is formed in a capacitor electrode 10 forming region of an inter-level insulating film 11-1 by use of the same manufacturing process as that of the first embodiment. Then, highly pure Cu is deposited in the groove 32 and on the inter-level insulating film 11-1 to form a Cu layer 43 by use of the sputtering method, for example.

Figure 21:
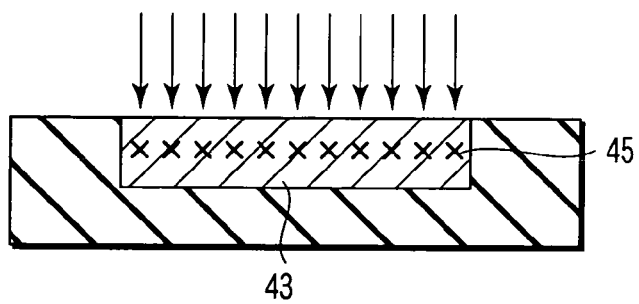
FIG. 21 is a cross sectional view showing one manufacturing step of the semiconductor device according to the modification 2 of this invention.

Next, as shown in FIG. 21, Mn elements 45 are doped into the Cu layer 43 by use of the ion-implantation method, for example.

Figure 22:
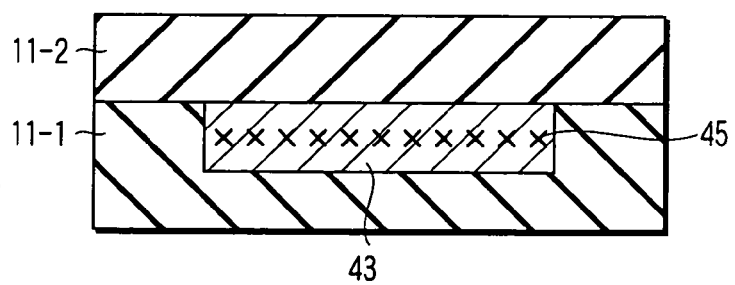
FIG. 22 is a cross sectional view showing one manufacturing step of the semiconductor device according to the modification 2 of this invention.

After this, as shown in FIG. 22, an $SiO_2$ film is deposited to form an inter-level insulating film 11-2 on the inter-level insulating film 11-1 and Cu layer 43 by use of the CVD method, for example.

Figure 23:
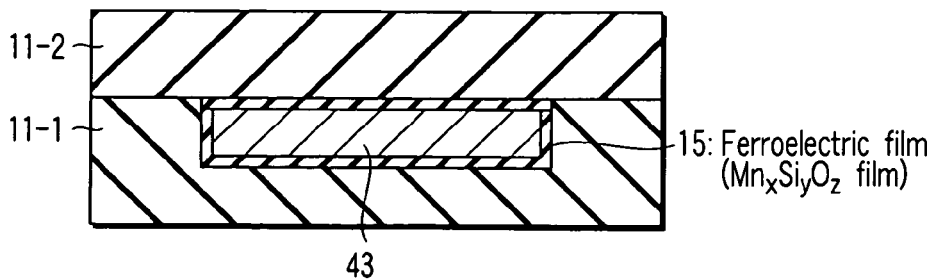
FIG. 23 is a cross sectional view showing one manufacturing step of the semiconductor device according to the modification 2 of this invention.

Then, as shown in FIG. 23, the heat treatment is performed for 30 min to 60 min at temperatures of 200° C. to 600° C., for example, while the Cu layer 43 is kept set in contact with the inter-level insulating films 11-1, 11-2. By the heat treatment, the Mn elements 45 doped in the Cu layer 43 are diffused to react with Si elements and O elements in the inter-level insulating films 11-1, 11-2. Thus, a uniform and extremely thin (2 nm to 3 nm) $Mn_xSi_yO_z$ film (ferroelectric film) 15 is formed on the interface with the Cu layer 43 in a self-alignment fashion.

Then, substantially the same manufacturing process as that used in the first embodiment is used to manufacture the semiconductor device shown in FIGS. 1 and 2.

According to the manufacturing method of the semiconductor device of the modification 2, the same effects as the effects (1) to (5) explained above can be attained. Further, the ferroelectric film 25 can be formed by use of the above manufacturing process as required.

Second Embodiment

Figure 24:
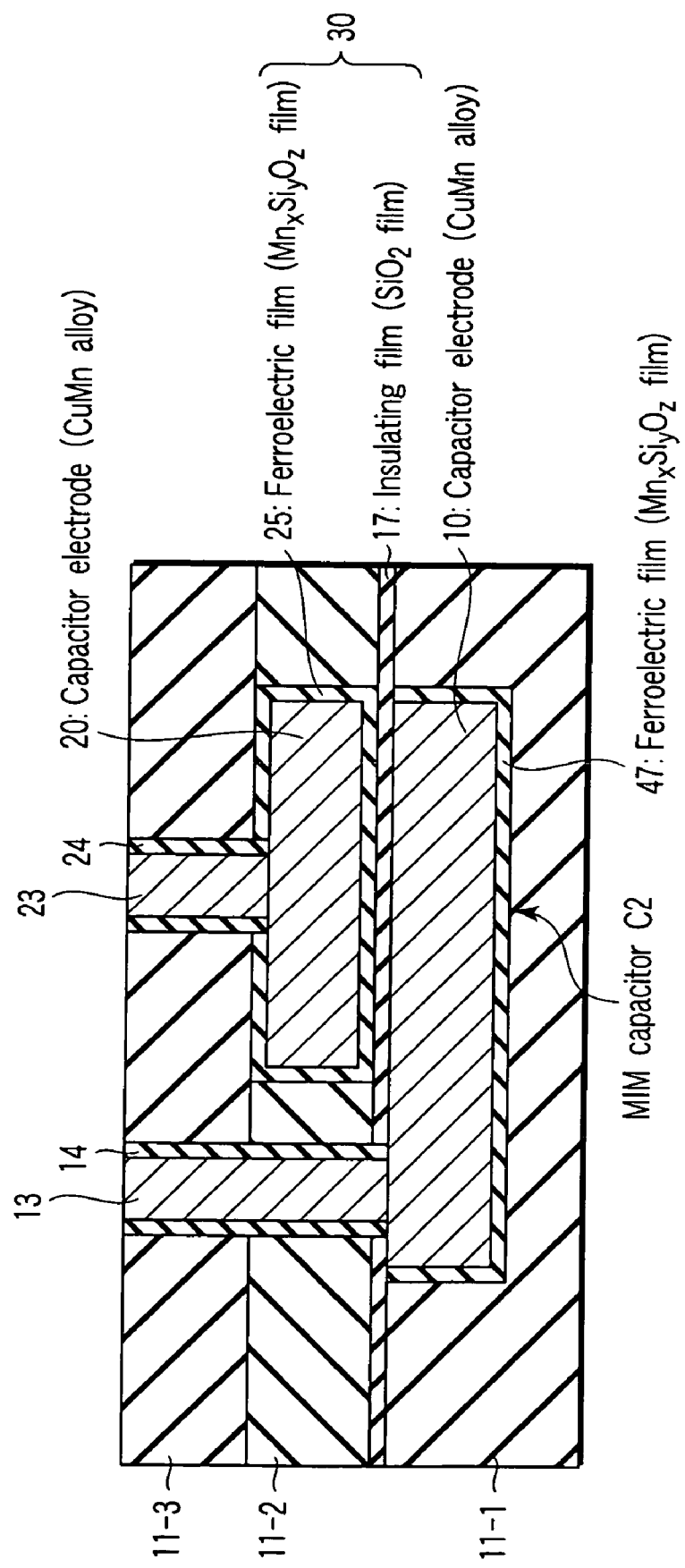
FIG. 24 is a cross sectional view showing a semiconductor device according to a second embodiment of this invention.

Next, a semiconductor device according to a second embodiment of this invention is explained with reference to FIG. 24. FIG. 24 is a cross sectional view showing the semiconductor device according to the present embodiment. In this explanation, the explanation for portions which are the same as those of the first embodiment is omitted.

As shown in FIG. 24, an MIM capacitor C2 is formed in inter-level insulating films 11-1 to 11-3. A capacitor insulating film 30 of the MIM capacitor C2 includes an insulating film 17 and ferroelectric film 25 and the present embodiment is different from the first embodiment in that the ferroelectric film 25 is formed only on the insulating film 17.

Next, a manufacturing method of the semiconductor device according to the present embodiment is explained with reference to FIGS. 25 to 28 by taking the semiconductor device shown in FIG. 24 as an example.

First, as shown in FIG. 25, a groove 32 is formed in a capacitor electrode 10 forming region of an inter-level insulating film 11-1 by use of the same manufacturing process as that of the first embodiment. Then, for example, a CuMn alloy layer is deposited to form a seed layer 39 in the groove 32 and on the inter-level insulating film 11-1 by use of the plating method.

Next, as shown in FIG. 26, a Cu layer 40 is formed on the seed layer 39 by use of the sputtering method, for example.

After this, the heat treatment is performed for 30 min to 60 min at temperatures of 200° C. to 600° C., for example, while the seed layer 39 is kept set in contact with the inter-level insulating film 11-1. By the heat treatment, Mn elements in the seed layer 39 are diffused to react with Si elements and O elements in the inter-level insulating film 11-1. Thus, the seed layer 39 is formed as a uniform and extremely thin (2 nm to 3 nm) $Mn_xSi_yO_z$ film (ferroelectric film) 47 in a self-alignment fashion. Further, during the above heat treatment process, the heat treatment is performed in an atmosphere containing oxygen to react extra Mn with oxygen O so as to form an MnO layer (not shown) on the surface of the Cu layer 40.

Next, as shown in FIG. 27, the MnO layer is removed and the seed layer 39 and Cu layer 40 are polished to the surface of the inter-level insulating film 11-1 and made flat by use of the CMP method, for example.

Then, as shown in FIG. 28, an $SiO_2$ film is deposited to form an insulating film 17 on the ferroelectric film 47, inter-level insulating film 11-1 and Cu layer 40 by use of the CVD method, for example.

After this, substantially the same manufacturing process as that used in the first embodiment is used to manufacture the semiconductor device shown in FIG. 24.

According to the manufacturing method of the semiconductor device of the present embodiment, the same effects as the effects (1) to (5) explained above can be attained. Further, the configuration and the manufacturing method thereof can be applied as required.

Third Embodiment

Figure 29:
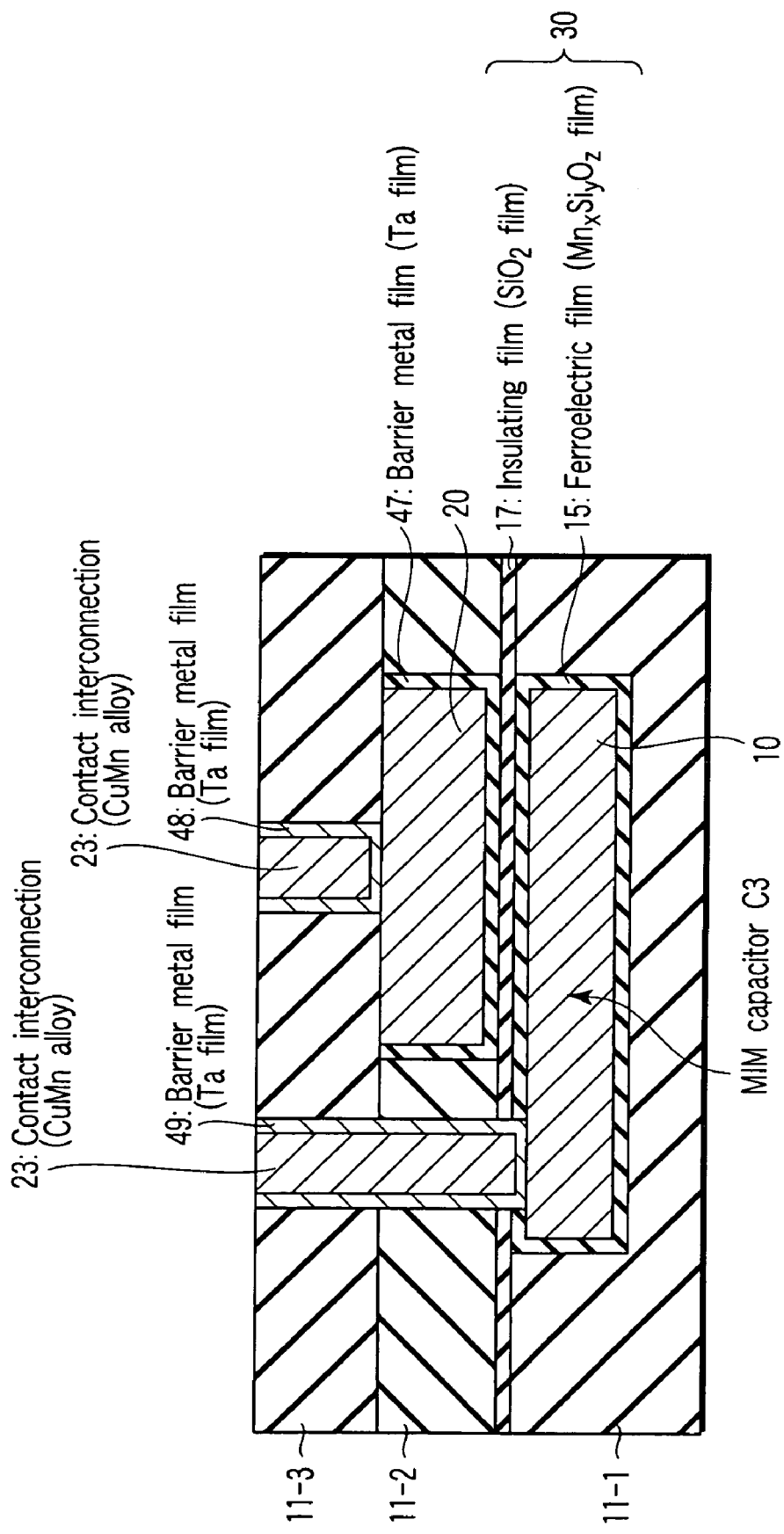
FIG. 29 is a cross sectional view showing a semiconductor device according to a third embodiment of this invention.

Next, a semiconductor device according to a third embodiment of this invention is explained with reference to FIG. 29. FIG. 29 is a cross sectional view showing the semiconductor device according to the present embodiment. In this explanation, the explanation for portions which are the same as those of the first embodiment is omitted.

As shown in FIG. 29, an MIM capacitor C3 is formed in inter-level insulating films 11-1 to 11-3. The semiconductor device according to the present embodiment is different from that of the first embodiment in the following points.

That is, a capacitor insulating film 30 of the MIM capacitor C3 includes, a ferroelectric film 15 and an insulating film 17. Further, a barrier metal film (Ta film) 49 is formed on the interface a contact interconnection 13 and a barrier metal film (Ta film) 48 is formed in the interface with a contact interconnection 23.

Further, the manufacturing method of the semiconductor device according to the present embodiment is different from that of the first embodiment in the following points.

That is, for example, a Ta (tantalum) film or the like is deposited to form a barrier metal film 47 along the inner wall of the groove by use of the sputtering method or the like before embedding the capacitor electrode 20 in the groove of the inter-level insulating film 11-2. Further, for example, a Ta film or the like is deposited to form a barrier metal film 49 along the inner wall of a trench by use of the sputtering method or the like before embedding the contact interconnection 13 in the trench formed in the inter-level insulating films 11-2, 11-3. Also, for example, a Ta film or the like is deposited to form a barrier metal film 48 along the inner wall of a trench by use of the sputtering method or the like before embedding the contact interconnection 23 in the trench formed in the inter-level insulating film 11-3.

According to the manufacturing method of the semiconductor device of the present embodiment, the same effects as the effects (1) to (5) explained before can be attained. Further, the configuration and the manufacturing method thereof can be applied as required.

Fourth Embodiment

Figure 30:
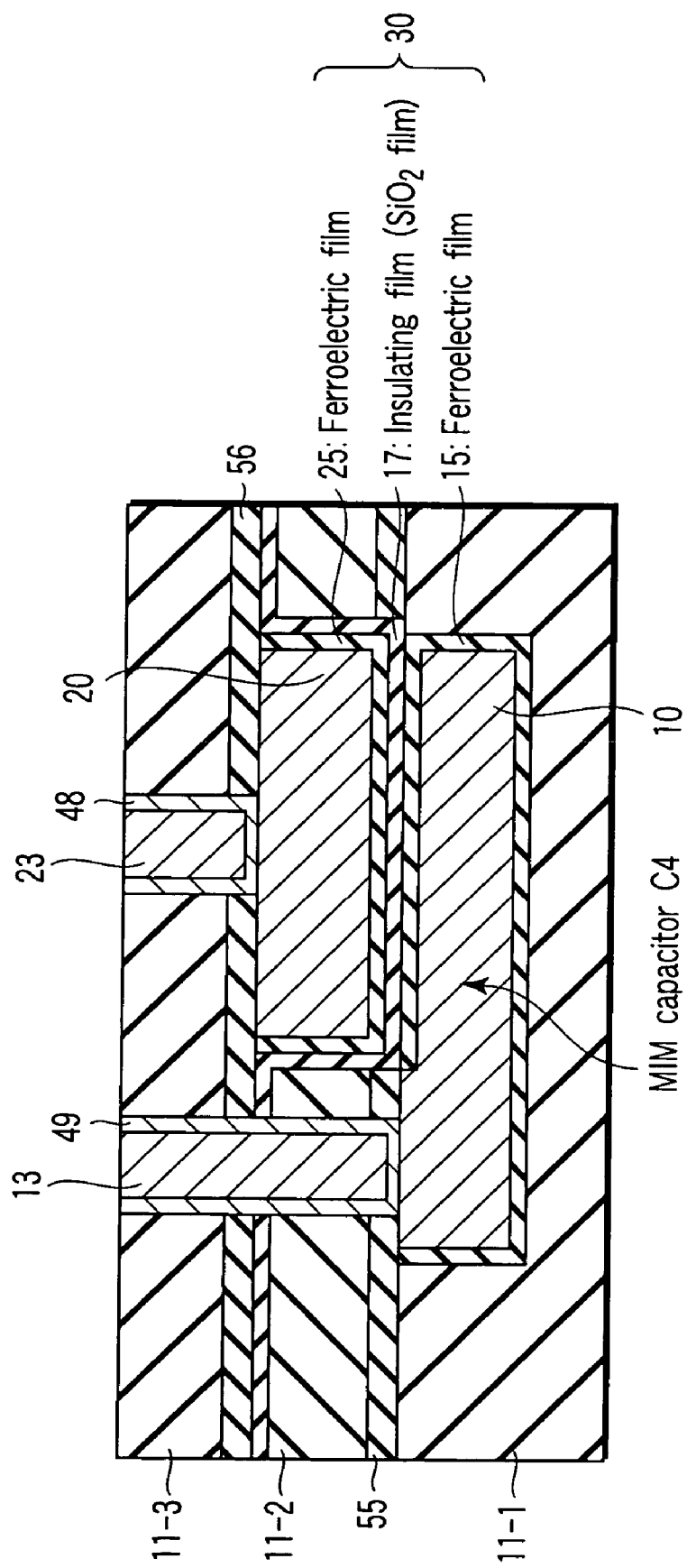
FIG. 30 is a cross sectional view showing a semiconductor device according to a fourth embodiment of this invention.

Next, a semiconductor device according to a fourth embodiment of this invention is explained with reference to FIG. 30. FIG. 30 is a cross sectional view showing the semiconductor device according to the present embodiment. In this explanation, the explanation for portions which are the same as those of the first embodiment is omitted.

As shown in FIG. 30, an MIM capacitor C4 is formed in inter-level insulating films 11-1 to 11-3. The semiconductor device according to the present embodiment is different from that of the first embodiment in the following points.

That is, an insulating film 55 is formed between the inter-level insulating films 11-1 and 11-2 and an insulating film 56 is formed between the inter-level insulating films 11-2 and 11-3. The insulating films 55, 56 are each formed of an insulating material which contains neither O nor at least one element selected from a group consisting of Si, C and F.

Further, an insulating film 17 is formed on the undersurface and side walls of a ferroelectric film 25 and on the undersurface of the insulating film 56. A barrier metal film (Ta film) 49 is formed on the interface with a contact interconnection 13 and a barrier metal film (Ta film) 48 is formed on the interface with a contact interconnection 23.

The manufacturing method of the semiconductor device of the present embodiment is different from that of the first embodiment in the following points.

Figure 31:
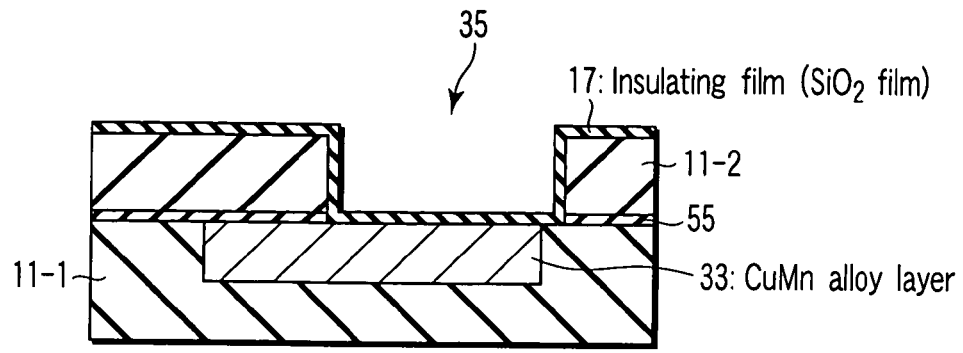
FIG. 31 is a cross sectional view showing one manufacturing step of the semiconductor device according to the fourth embodiment of this invention.

That is, as shown in FIG. 31, a CuMn alloy layer 33 is formed in the inter-level insulating film 11-1 by use of the same manufacturing method as that used in the first embodiment. Then, for example, an insulating film which contains neither O nor at least one element selected from a group consisting of Si, C and F is deposited to form an insulating film 55 by use of the CVD method or the like. Next, an inter-level insulating film 11-2 is formed on the insulating film 55 and a groove 35 which exposes the surface of the CuMn alloy layer 33 is formed in a capacitor electrode 10 forming region of the inter-level insulating film 11-2. After this, an $SiO_2$ film is deposited to form an insulating film 17 on the inner wall of the groove 35 and on the inter-level insulating film 11-2 by use of the CVD method, for example.

Figure 32:
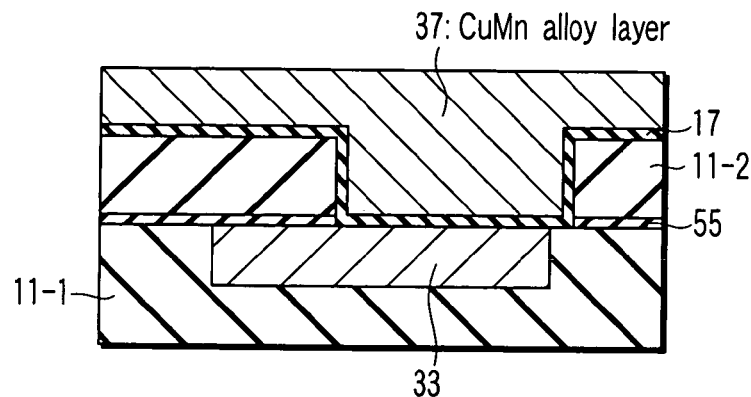
FIG. 32 is a cross sectional view showing one manufacturing step of the semiconductor device according to the fourth embodiment of this invention.

Next, as shown in FIG. 32, a CuMn alloy layer 37 is formed on the insulating film 17 by use of the sputtering method, for example.

Figure 33:
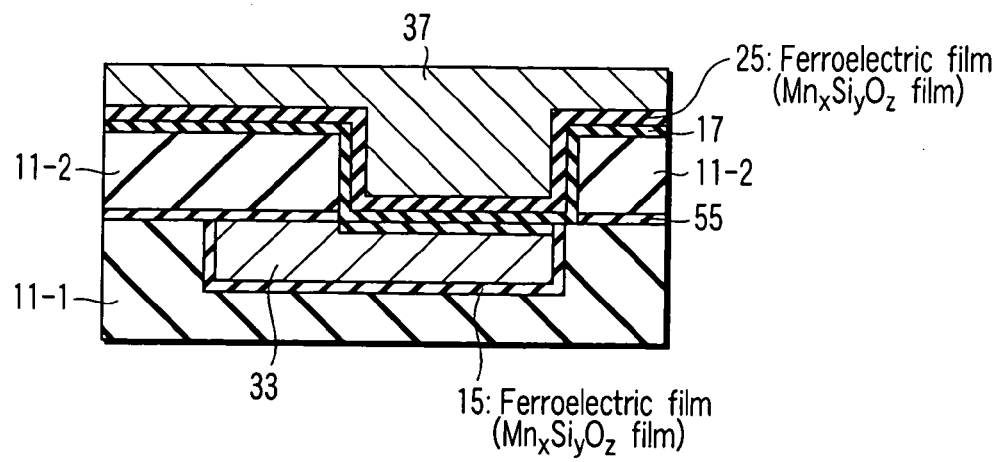
FIG. 33 is a cross sectional view showing one manufacturing step of the semiconductor device according to the fourth embodiment of this invention.

Then, as shown in FIG. 33, for example, the heat treatment is performed for 30 min to 60 min at temperatures of 200° C. to 600° C. while the CuMn alloy layer 33 is kept set in contact with insulating film 17 and inter-level insulating film 11-1 and the CuMn alloy layer 37 is kept set in contact with insulating film 17. By the heat treatment, Mn elements in the CuMn alloy layers 33, 37 are diffused to react with Si elements and O elements in the inter-level insulating films 11-1, 11-2 and insulating film 17. Thus, uniform and extremely thin (2 nm to 3 nm) $Mn_xSi_yO_z$ films (ferroelectric films) 15, 25 are formed on the respective interfaces set in contact with the above insulating films in a self-alignment fashion.

Then, the CuMn alloy layer 37 and ferroelectric film 25 are polished to the surface of the inter-level insulating film 11-3, made flat by use of the CMP method and thus embedded in the groove 35 (not shown). After this, the same manufacturing method as that of the first embodiment is used to manufacture the semiconductor device shown in FIG. 30.

According to the semiconductor device and the manufacturing method thereof in the present embodiment, the same effects as the effects (1) to (5) explained in the first embodiment can be attained. Further, the configuration and manufacturing method thereof can be applied as required.

Fifth Embodiment

One Example of Application of Aluminum Electrode

Figure 34:
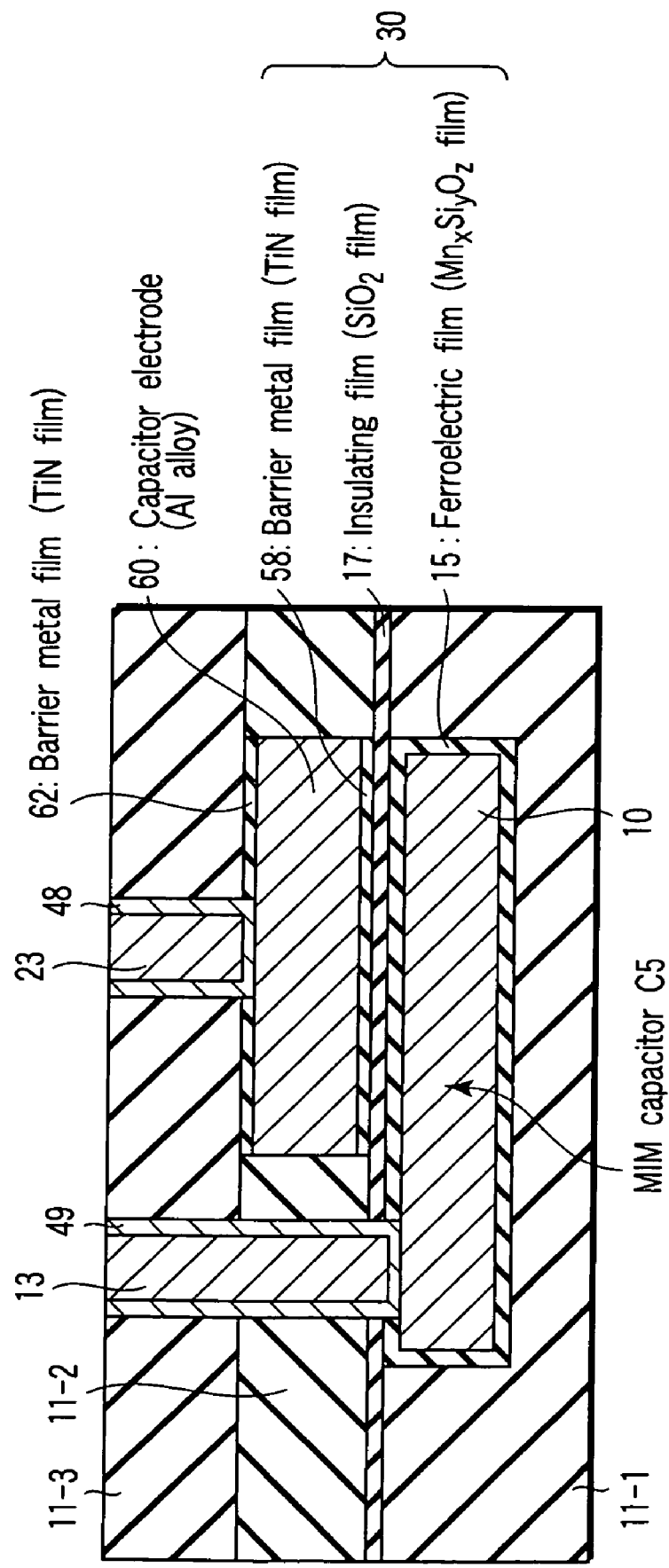
FIG. 34 is a cross sectional view showing a semiconductor device according to a fifth embodiment of this invention.

Next, a semiconductor device according to a fifth embodiment of this invention is explained with reference to FIG. 34. FIG. 34 is a cross sectional view showing the semiconductor device according to this embodiment. This embodiment relates to a case wherein Al (aluminum) is applied as capacitor electrodes. In this explanation, the explanation for portions which are the same as those of the first embodiment is omitted.

As shown in FIG. 34, the semiconductor device of the present embodiment is different from that of the first embodiment in the following points. That is, a capacitor insulating film 30 includes a ferroelectric film 15, and insulating film 17 and barrier film (TiNa film) 58. Further, a capacitor electrode 60 formed of an Al alloy is provided in the inter-level insulating film 11-2 to sandwich the capacitor insulating film 30 in cooperation with the capacitor electrode 30. Further, a barrier metal film (TiN film) 58, 62 is provided below and over the capacitor electrode 60.

The manufacturing method of the semiconductor device of the present embodiment is substantially the same as that of the first embodiment, and therefore, the detail explanation thereof is omitted.

According to the semiconductor device and the manufacturing method thereof in the present embodiment, the same effects as the effects (1) to (5) explained before can be attained. Further, the configuration and manufacturing method thereof can be applied as required.

Sixth Embodiment

One Example of Stacked Structure

Figure 35:
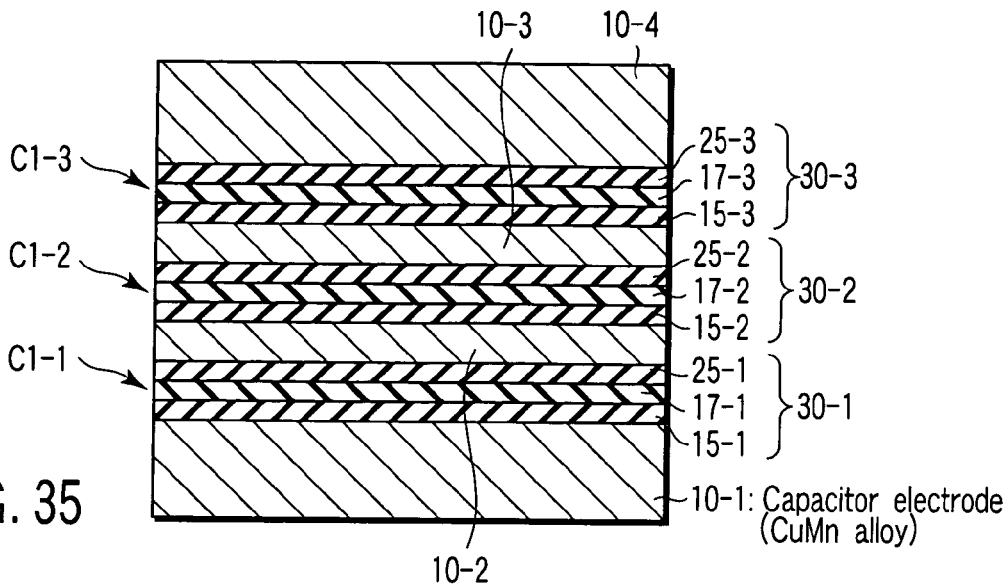
FIG. 35 is a cross sectional view showing a semiconductor device according to a sixth embodiment of this invention.

Next, a semiconductor device according to a sixth embodiment of this invention is explained with reference to FIG. 35. FIG. 35 is a cross sectional view showing the semiconductor device according to the present embodiment. The present embodiment relates to a stacked structure obtained by stacking a plurality of MIM capacitors. In this explanation, the explanation for portions which are the same as those of the third embodiment is omitted.

As shown in FIG. 35, MIM capacitors C1-1 to C1-3 are sequentially stacked.

The MIM capacitor C1-1 includes capacitor electrodes 10-1, 10-2 and a capacitor insulating film 30-1 disposed between the capacitor electrodes 10-1 and 10-2. The capacitor electrodes 10-1, 10-2 are formed of a CuMn alloy. The capacitor insulating film 30-1 has a ferroelectric film ($Mn_xSi_yO_z$ film) 15-1, insulating film ($SiO_2$ film) 17-1 and ferroelectric film ($Mn_xSi_yO_z$ film) 25-1 which are sequentially laminated.

The MIM capacitor C1-2 includes capacitor electrodes 10-2, 10-3 and a capacitor insulating film 30-2 disposed between the capacitor electrodes 10-2 and 10-3. The capacitor electrodes 10-3 is formed of a CuMn alloy. The capacitor insulating film 30-2 has a ferroelectric film ($Mn_xSi_yO_z$ film) 15-2, insulating film ($SiO_2$ film) 17-2 and ferroelectric film ($Mn_xSi_yO_z$ film) 25-2 which are sequentially laminated.

The MIM capacitor C1-3 includes capacitor electrodes 10-3, 10-4 and a capacitor insulating film 30-3 disposed between the capacitor electrodes 10-3 and 10-4. The capacitor electrodes 10-4 is formed of a CuMn alloy. The capacitor insulating film 30-3 has a ferroelectric film ($Mn_xSi_yO_z$ film) 15-3, insulating film ($SiO_2$ film) 17-3 and ferroelectric film ($Mn_xSi_yO_z$ film) 25-3 which are sequentially laminated.

Next, a manufacturing method of the semiconductor device according to the present embodiment is explained with reference to FIGS. 36 and 37 by taking the semiconductor device shown in FIG. 35 as an example.

Figure 36:
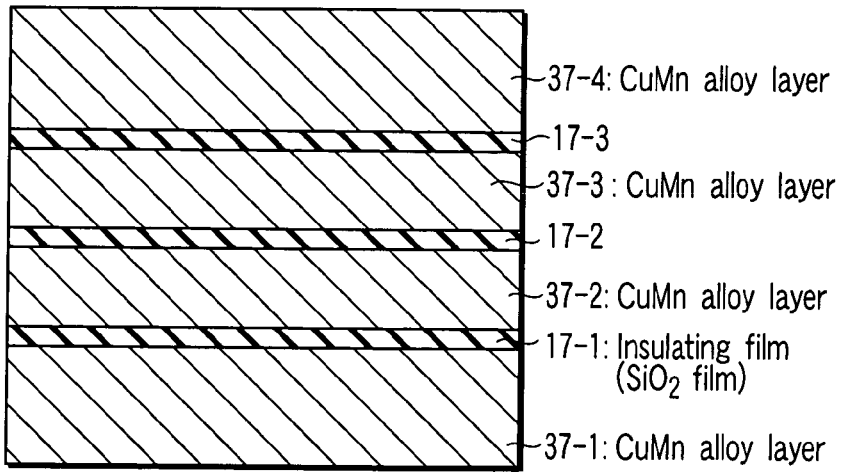
FIG. 36 is a cross sectional view showing one manufacturing step of the semiconductor device according to the sixth embodiment of this invention.

First, as shown in FIG. 36, a CuMn alloy layer 37-1 is formed on an inter-level insulating film (not shown) by use of the sputtering method, for example. Then, an $SiO_2$ film is formed on the CuMn alloy layer 37-1 to form an insulating film 17-1 by use of the CVD method, for example.

After this, a CuMn alloy layer 37-2, insulating film 17-2, CuMn alloy layer 37-3, insulating film 17-3 and CuMn alloy layer 37-4 are sequentially formed to form the laminated structure shown in FIG. 36 by use of the same manufacturing method as that used for forming the CuMn alloy layer 37-1 and insulating film 17-1.

Figure 37:
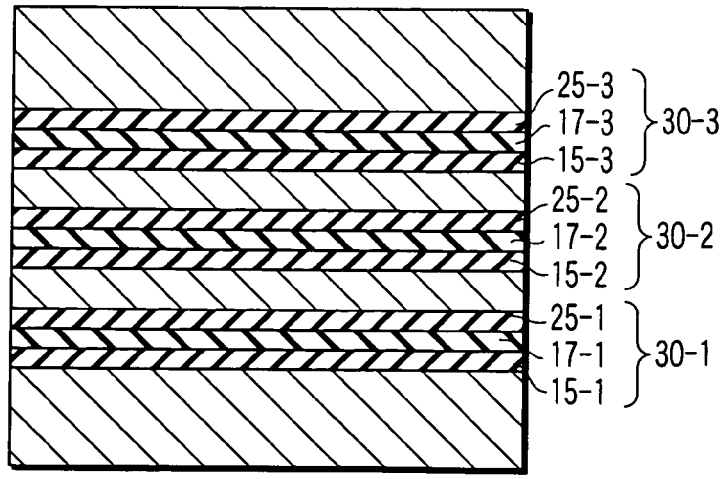
FIG. 37 is a cross sectional view showing one manufacturing step of the semiconductor device according to the sixth embodiment of this invention.

Next, as shown in FIG. 37, for example, the heat treatment is performed for 30 min to 60 min at temperatures of 200° C. to 600° C. with the CuMn alloy layers 33-1 to 33-4 kept set in contact with the insulating films 17-1 to 17-3. By the heat treatment, Mn elements in the CuMn alloy layers 33-1 to 33-4 are diffused to react with Si elements and O elements in the insulating films 17-1 to 17-3. Then, uniform $Mn_xSi_yO_z$ films (ferroelectric films) 15-1 to 15-3 and 25-1 to 25-3 with extremely thin film thickness (2 nm to 3 nm) are formed in a self-alignment fashion on the respective interfaces set in contact with the insulating films 17-1 to 17-3. Thus, the semiconductor device shown in FIG. 35 is formed by the above manufacturing method.

According to the semiconductor device and the manufacturing method thereof in the present embodiment, the same effects as the effects (1) to (5) explained before can be attained.

Further, the film thickness of the capacitor insulating films 30-1 to 30-3 can be controlled and the capacitances of the MIM capacitors C-1 to C-3 can be independently and separately controlled by adequately selecting the reaction condition at the time of formation of the insulating films 17-1 to 17-3 and controlling the film thickness thereof. Therefore, it is advantageous in that the capacitances of the MIM capacitors C-1 to C-3 can be adjusted and changed.

Seventh Embodiment

One Example of Trench Structure

Next, a semiconductor device according to a seventh embodiment of this invention is explained with reference to FIG. 38. FIG. 38 is a cross sectional view showing the semiconductor device according to the present embodiment. The present embodiment relates to a trench structure obtained by forming an MIM capacitor in a trench formed by a damascene process. In this explanation, the explanation for portions which are the same as those of the third embodiment is omitted.

As shown in FIG. 38, an MIM capacitor C6 is formed by use of the structure of trenches TR1, TR2 formed in an inter-level insulating film 11-1.

A capacitor electrode 10 is formed along the inner walls of the trenches TR1, TR2. A ferroelectric film 15 is formed to surround the interface of the capacitor electrode 10. An insulating film 17 is formed on and along the ferroelectric film 15.

A capacitor electrode 20 is formed above the capacitor electrode 10 and provided to fill the trenches TR1, TR2. A ferroelectric film 25 is formed on the interfaces between the capacitor electrode 20 and the insulating film 17 and an inter-level insulating film 11-2.

The ferroelectric films 15, 25 formed between the capacitor electrodes 10 and 20 act as a capacitor insulating film 30 of the MIM capacitor C6.

Next, a manufacturing method of the semiconductor device according to the present embodiment is explained by taking the semiconductor device shown in FIG. 38 as an example.

First, for example, an anisotropic etching process such as the RIE method is performed in preset positions of the inter-level insulating film 11-1 to form trenches TR1, TR2 (not shown).

Then, a CuMn alloy layer is formed on the inner walls of the trenches TR1, TR2 by use of the sputtering method or CVD method, for example.

Next, an $SiO_2$ film is deposited on the CuMn alloy layer to form an insulating film 17 by use of the CVD method, for example.

After this, a CuMn alloy layer is formed on the insulating film 17 by use of the sputtering method, for example.

Then, the CuMn alloy layer is polished to the surface of the inter-level insulating film 11-2 by use of the CMP method, for example, and thus embedded in the trenches TR1, TR2.

Next, for example, the heat treatment is performed for 30 min to 60 min at temperatures of 200° C. to 600° C. to diffuse Mn elements in the CuMn alloy layer so as to react the Mn elements with Si elements and O elements in the insulating film 17 and inter-level insulating films 11-1, 11-2. Thus, uniform $Mn_xSi_yO_z$ films (ferroelectric films) 15, 25 with extremely thin film thickness (2 nm to 3 nm) are formed in a self-alignment fashion on the respective interfaces.

After this, the semiconductor device shown in FIG. 38 is formed by use of the same manufacturing method as that of the first embodiment.

According to the semiconductor device and the manufacturing method thereof in the present embodiment, the same effects as the effects (1) to (5) explained before can be attained.

The capacitor electrode 10 is formed on the bottom surfaces of the trenches TR1, TR2 and the capacitor electrode 20 is formed above the capacitor electrode 10 to fill the trenches TR1, TR2. As a result, the MIM capacitor C6 having the capacitor electrodes 10, 20 is formed by use of the structure of the trenches TR1, TR2.

Thus, an advantage that the surface areas of the capacitor electrodes 10, 20 are increased to increase the capacitances of the capacitors can be attained.

Eighth Embodiment

One Example of Other Capacitor Insulating Films

Next, a semiconductor device according to an eighth embodiment of this invention is explained with reference to FIGS. 39 to 46. FIGS. 39 to 46 are cross sectional views each showing a portion near the capacitor insulating film of the semiconductor device according to the present embodiment. The present embodiments relate to examples of various capacitor insulating films of MIM capacitors. In this explanation, the explanation for portions which are the same as those of the third embodiment is omitted.

As shown in FIG. 39, a capacitor insulating film 30 of an MIM capacitor C7 is formed between capacitor electrodes 10 and 20. The capacitor insulating film 30 includes an insulating film 17, a ferroelectric film 15 formed on the interface between the capacitor electrode 10 and the insulating film 17 and a ferroelectric film 25 formed on the interface between the capacitor electrode 20 and the insulating film 17.

As shown in FIG. 40, a capacitor insulating film 30 of an MIM capacitor C8 includes insulating films ($SiO_2$ films) 17-1, 17-2, a ferroelectric film 25 formed on the interface between the capacitor electrode 20 and the insulating film 17-1 and a ferroelectric film (SiN film) 71 formed between the insulating films 17-1 and 17-2.

As shown in FIG. 41, a capacitor insulating film 30 of an MIM capacitor C9 includes an insulating film 17, a ferroelectric film 25 formed on the interface between the capacitor electrode 20 and the insulating film 17 and a SiN film 72 formed between the capacitor electrode 10 and the insulating films 17.

As shown in FIG. 42, a capacitor insulating film 30 of an MIM capacitor C10 includes an insulating film 17 and a ferroelectric film 25 formed on the interface between the capacitor electrode 20 and the insulating film 17.

As shown in FIG. 43, a capacitor insulating film 30 of an MIM capacitor C11 includes insulating films 17-1, 17-2, a ferroelectric film 25 formed on the interface between the capacitor electrode 20 and the insulating film 17-1 and a ferroelectric film (SiN film) 71 formed between the insulating films 17-1 and 17-2.

As shown in FIG. 44, a capacitor insulating film 30 of an MIM capacitor C12 includes an insulating film 17 and a ferroelectric film 15 formed on the interface between the capacitor electrode 10 and the insulating film 17.

As shown in FIG. 45, a capacitor insulating film 30 of an MIM capacitor C13 includes insulating films 17-1, 17-2, a ferroelectric film 15 formed on the interface between the capacitor electrode 10 and the insulating film 17-2 and a ferroelectric film (SiN film) 71 formed between the insulating films 17-1 and 17-2.

As shown in FIG. 46, a capacitor insulating film 30 of an MIM capacitor C14 is formed of only a ferroelectric film 15 formed on the interface between the capacitor electrodes 10 and 20.

When the MIM capacitor C14 is formed, for example, a CuMn alloy layer is first formed by use of the same manufacturing process as that of the first embodiment and then an $SiO_2$ film (silicon oxide film) is formed on the CuMn alloy layer by use of the CVD method or the like. At the time of formation of the $SiO_2$ film, the film thickness of the $SiO_2$ film is controlled to be set substantially equal to the film thickness (2 nm to 3 nm) of a ferroelectric film 15 to be later formed by adequately selecting the reaction condition such as the concentration, temperatures and the like.

Then, a CuMn alloy layer is formed by the same manufacturing process as that of the first embodiment.

After this, for example, the heat treatment is performed for 30 min to 60 min at temperatures of 200° C. to 600° C. to diffuse Mn elements in the CuMn alloy layer so as to react the Mn elements with Si elements and O elements in the $SiO_2$ film. Thus, a uniform $Mn_xSi_yO_z$ film (ferroelectric film) 15 with extremely thin film thickness (2 nm to 3 nm) is formed on the interface in a self-alignment fashion.

At the time of the heat treatment process, the film thickness of the $SiO_2$ film is controlled to be set substantially equal to the film thickness of the ferroelectric film 15. Therefore, when the $SiO_2$ film is formed by reaction, it is used as the ferroelectric film 15.

As is explained in FIGS. 39 to 46, since at least one layer of the capacitor insulating film 30 includes a ferroelectric film ($Mn_xSi_yO_z$ film), the same effects as the effects (1) to (5) explained before can be attained. Further, various types of configurations and the manufacturing methods thereof can be applied as required.

As shown in FIG. 46, all of the capacitor insulating films can be formed by use of the ferroelectric film ($Mn_xSi_yO_z$ film) 15.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
a first capacitor which includes:
  a first capacitor insulating film at least including a first insulating film and a first ferroelectric film formed in contact with the first insulating film, the first ferroelectric film containing a compound of a preset metal element and a constituent element of the first insulating film as a main component and having a dielectric constant larger than that of the first insulating film, and
  first and second capacitor electrodes formed to sandwich the first capacitor insulating film and formed of one of Cu and a material containing Cu as a main component,
  wherein the preset metal element contains at least one element selected from a group consisting of Mn, Nb, Zr, Cr, V, Y, Tc and Re, the constituent element contains O and at least one element selected from a group consisting of Si, C and F, and the first ferroelectric film contains a material selected from a group consisting of $\alpha_xO_y$, $\alpha_xSi_yO_z$, $\alpha_xC_yO_z$ and $\alpha_xF_yO_z$ as a main component, $\alpha$ indicating the preset metal element.

2. The semiconductor device according to claim 1, wherein the first ferroelectric film is formed in contact with one of the first and second capacitor electrodes.

3. The semiconductor device according to claim 1, wherein the first capacitor insulating film further includes a second insulating film.

4. The semiconductor device according to claim 1, wherein the first capacitor insulating film further includes a second ferroelectric film which is formed in contact with the first insulating film in opposition to the first ferroelectric film, contains a compound of a preset metal element and a constituent element of the first insulating film as a main component and has a dielectric constant larger than that of the first insulating film.

5. The semiconductor device according to claim 1, wherein the first capacitor is formed along an inner wall of a trench formed in an inter-level insulating film.

6. The semiconductor device according to claim 1, further comprising a second capacitor formed on the first capacitor, wherein the second capacitor includes:
  a second capacitor insulating film at least including a second insulating film and a second ferroelectric film formed in contact with the second insulating film, containing a compound of a preset metal element and a constituent element of the second insulating film as a main component and having a dielectric constant larger than that of the second insulating film, and
  a third capacitor electrode formed to sandwich the second capacitor insulating film in cooperation with one of the first and second capacitor electrodes and formed of one of Cu and a material containing Cu as a main component.

7. The semiconductor device according to claim 1, further comprising:
  an inter-level insulating film formed to cover the first capacitor,
  a first contact interconnection formed in the inter-level insulating film, formed of one of Cu and a material containing Cu as a main component and electrically connected to the first capacitor electrode, and
  a first barrier film formed on an interface between the inter-level insulating film and the first contact interconnection, containing a compound of a preset metal element and a constituent element of the inter-level insulating film as a main component and acting to prevent diffusion of Cu elements in the first contact interconnection.

8. The semiconductor device according to claim 7, further comprising:
   a second contact interconnection formed in the inter-level insulating film, formed of one of Cu and a material containing Cu as a main component and electrically connected to the second capacitor electrode, and
   a second barrier film formed on an interface between the inter-level insulating film and the second contact interconnection, containing a compound of a preset metal element and a constituent element of the inter-level insulating film as a main component and acting to prevent diffusion of Cu elements in the second contact interconnection.

9. The semiconductor device according to claim 8, wherein the preset metal element contains at least one element selected from a group consisting of Mn, Nb, Zr, Cr, V, Y, Tc and Re, the constituent element contains O and at least one element selected from a group consisting of Si, C and F, and the first and second barrier films and the first ferroelectric film each contain a material selected from a group consisting of $\alpha_x O_y$, $\alpha_x Si_y O_z$, $\alpha_x C_y O_z$ and $\alpha_x F_y O_z$ as a main component, a indicating the preset metal element.

10. A semiconductor device comprising:
    a capacitor which includes:
    a capacitor insulating film at least including a first insulating film and a ferroelectric film formed in contact with the first insulating film, containing a compound of a preset metal element and a constituent element of the first insulating film as a main component and having a dielectric constant larger than that of the first insulating film,
    a first capacitor electrode formed of one of Cu and a material containing Cu as a main component, and
    a second capacitor electrode formed to sandwich the capacitor insulating film in cooperation with the first capacitor electrode.

11. The semiconductor device according to claim 10, further comprising:
    an inter level insulating film having a groove, the first capacitor electrode being embedded in the groove, and
    a barrier film formed on an interface between the inter-level insulating film and the first capacitor electrode, containing a compound of the preset metal element and a constituent element of the inter-level insulating film as a main component and acting to prevent diffusion of Cu element in the first capacitor electrode.

12. The semiconductor device according to claim 11, wherein the ferroelectric film and the barrier film are formed integrally around the first capacitor electrode.

13. The semiconductor device according to claim 10, wherein the ferroelectric film and the first capacitor electrode are formed in contact with each other.

14. The semiconductor device according to claim 10, wherein the capacitor insulating film further includes a second insulating film.

15. The semiconductor device according to claim 10, wherein the first capacitor electrode are formed at the matrial containing Cu as a main component and the preset metal element.

* * * * *